US008866130B2

(12) United States Patent
Harai

(10) Patent No.: US 8,866,130 B2
(45) Date of Patent: Oct. 21, 2014

(54) LIGHT-EMITTING DEVICE AND LIGHTING APPARATUS

(71) Applicant: Zeon Corporation, Tokyo (JP)

(72) Inventor: Kenichi Harai, Tokyo (JP)

(73) Assignee: Zeon Corporation, Tokyo (JP)

( * ) Notice: Subject to any disclaimer, the term of this patent is extended or adjusted under 35 U.S.C. 154(b) by 212 days.

(21) Appl. No.: 13/627,044

(22) Filed: Sep. 26, 2012

(65) Prior Publication Data
US 2013/0075707 A1     Mar. 28, 2013

(30) Foreign Application Priority Data

Sep. 28, 2011   (JP) ................................ 2011-212647

(51) Int. Cl.
*H01L 51/52* (2006.01)
(52) U.S. Cl.
CPC ........ *H01L 51/5234* (2013.01); *H01L 51/5275* (2013.01); *H01L 51/5268* (2013.01); *H01L 2251/5361* (2013.01)
USPC .................. 257/40; 257/98; 257/79; 257/81; 257/E21.018; 438/82; 438/99
(58) Field of Classification Search
CPC ............ H01L 51/5234; H01L 51/5268; H01L 2251/5361; H01L 51/5262; H01L 51/5361
USPC .................. 257/40, 79, 81, 98, 99, E51.018; 438/82, 99
See application file for complete search history.

(56) References Cited

U.S. PATENT DOCUMENTS

| 6,997,595 B2 * | 2/2006 | Mi et al. .................. 362/626 |
| 2005/0046338 A1 * | 3/2005 | Park ......................... 313/504 |
| 2005/0212989 A1 | 9/2005 | Kashiwagi et al. |

FOREIGN PATENT DOCUMENTS

WO    WO 2004/017106 A1    2/2004

* cited by examiner

*Primary Examiner* — Thinh T Nguyen
(74) *Attorney, Agent, or Firm* — Birch, Stewart, Kolasch & Birch, LLP

(57) ABSTRACT

The light output surface structure layer has a concavo-convex structure on a surface opposite to the organic EL element. The concavo-convex structure includes flat surface portions parallel to one surface of the organic EL element and an inclined surface portion tilted relative to the flat surface portions. The projected area which is formed by projecting the inclined surface portion in a direction perpendicular to the flat surface portions onto a plane parallel to the flat surface portions is equal to or less than 0.1 times the total area of the flat surface portions. On a cross section of a flat surface portion cut along a plane parallel to the width and thickness directions thereof, the ratio H/W is 1 or greater and 2.5 or less, where H and W are the height and the width thereof, respectively.

5 Claims, 10 Drawing Sheets

LIGHT-EMITTING DEVICE AND LIGHTING APPARATUS

BACKGROUND OF THE INVENTION

1. Field of the Invention

The present invention relates to light-emitting devices. More particularly, the invention relates to a light-emitting device which includes an organic electroluminescent element (hereinafter appropriately referred to as the "organic EL element").

2. Description of the Related Art

The light-emitting device with an organic EL element can have a planar shape and provide light of white color or a color close thereto. Accordingly, the light-emitting device with an organic EL element is thought to be employed for use as, e.g., a light source of a lighting apparatus for lighting space in living environments, or a backlight unit for display devices.

However, the currently known organic EL element is too low in efficiency to be employed for the aforementioned lighting use. In this context, it is desired to improve the light extraction efficiency of the organic EL element. Known as a method for providing the organic EL element with an improved light extraction efficiency is to provide a surface of the organic EL element of a single-side emission type with various types of concavo-convex structures. For example, it is proposed to provide a surface of the organic EL element with a structure layer having a concavo-convex structure (see Patent Literature 1). This concavo-convex structure can achieve the favorable collection of light, providing enhancement in the aforementioned light extraction efficiency.

PRIOR ART LIST

Patent Literature

[Patent Literature 1] International Publication No. 2004/017106

SUMMARY OF THE INVENTION

The light-emitting devices with an organic EL element include the light emitting device of a double-side emission type, which extracts light from both sides, in addition to that of the single-side emission type. Since the double-sided light emitting device is required to have high light extract efficiency as well, the inventor attempted to provide a double-sided light emitting device with the concavo-convex structure in the same manner as for the single-sided light emitting device. However, it was found out that the desired performance is not achievable merely by applying the concavo-convex structure of the single-sided light emitting device, without any modification, to the double-sided light emitting device.

Usually, each layer constituting the double-sided light emitting device is capable of transmitting light. Accordingly, the typical double-sided light emitting device is adapted to have a see-through feature, so that a viewer can see through the light-emitting device. Since the see-through feature can improve quality of design and diversify varieties of usages available, having the see-through feature is one of the advantages of the double-sided light emitting device. It is thus desirable to keep the feature of allowing the viewer to see through the light-emitting device even when the concavo-convex structure is provided in order to extract light with high efficiency.

On the other hand, from the perspective of enhancing the light extraction efficiency, the single-sided light emitting device is provided with a reflecting layer (for example, a reflecting electrode), so that the reflecting layer reflects light emitted from the organic EL element to the side that is opposite to the light output surface. Accordingly, since the light which has entered into the single-sided light emitting device from outside will also be reflected on the reflecting layer, the light-emitting device cannot be seen through. For these reasons, in general, a conventional concavo-convex structure provided to the single-sided light emitting device has not been studied concerning the see-through feature for the double-sided light emitting device. Accordingly, provision of the conventional concavo-convex structure on the double-sided light emitting device usually increases haze so as not to allow the light-emitting device to be seen through.

The present invention was developed in view of the aforementioned problems. It is therefore an object of the present invention to provide a light-emitting device which enables light to be extracted therefrom with high efficiency while maintaining the see-through feature. It is another object of the invention to provide a lighting apparatus which includes the light-emitting device.

As a result of intensive studies conducted aiming at solving the aforementioned problems, the inventor found out the following. That is, it was found out that a light-emitting device having a concavo-convex structure on a light output surface thereof could be implemented so as to enable light to be extracted therefrom with high efficiency, while maintaining the see-through feature, by controlling the area ratio between the flat surface portion and the inclined surface portion of the concavo-convex structure as well as the ratio between the height and the width of part of the flat surface portion. The present invention has thereby been completed.

That is, the present invention is configured as follows.

(1) A light-emitting device comprising:
an organic electroluminescent element of a double-side emission type having a first transparent electrode layer, a light-emitting layer, and a second transparent electrode layer provided in this order; and
a light output surface structure layer provided directly or indirectly on at least one surface of the organic electroluminescent element, wherein
the light output surface structure layer includes a concavo-convex structure on a surface opposite to the organic electroluminescent element, the concavo-convex structure having flat surface portions parallel to one surface of the organic electroluminescent element and an inclined surface portion tilted relative to the flat surface portions,
a projected area formed by projecting the inclined surface portion in a direction perpendicular to the flat surface portions onto a plane parallel to the flat surface portions is equal to or less than 0.1 times a total area of the flat surface portions, and
the flat surface portions have a specific flat surface portion with a ratio H/W of 1 or greater and 2.5 or less, where H and W are a height and a width of the specific flat surface portion, respectively, on a cross section thereof cut along a plane parallel to a width direction and a thickness direction thereof.

(2) The aforementioned light-emitting device, wherein a maximum value of differences between levels of the flat surface portions in a thickness direction thereof is 130 μm or less in the concavo-convex structure.

(3) The aforementioned light-emitting device, wherein the inclined surface portion is tilted at an inclination angle equal to or greater than 80° and less than 90° relative to the flat surface portions.

(4) A lighting apparatus comprising the aforementioned light-emitting device.

According to the present invention, it is possible to implement a light-emitting device from which light can be extracted with high efficiency while maintaining the see-through feature, and a lighting apparatus which includes the light-emitting device.

DETAILED DESCRIPTION OF THE PREFERRED EMBODIMENTS

The present invention will be described in more detail hereinbelow with reference to the embodiments and illustrations; however, the present invention will not be limited to the embodiments and illustrations to be shown below, and may be arbitrarily modified without departing from the scope of the appended claims and the scope of the equivalents thereof.

In the embodiments to be described below, the expression that components are "parallel" or "perpendicular" may tolerate a range of error which may not compromise the effects of the present invention, for example, within a range of ±5°. Furthermore, unless otherwise specified, the expression, "along" a certain direction means "in parallel to" that certain direction. Furthermore, unless otherwise specified, the thickness direction of each layer that constitutes a light-emitting device is consistent with the thickness direction of the light-emitting device, and a simplified expression, "the thickness direction" will refer to the thickness direction of the light-emitting device.

[1. First Embodiment]

Figure 1:
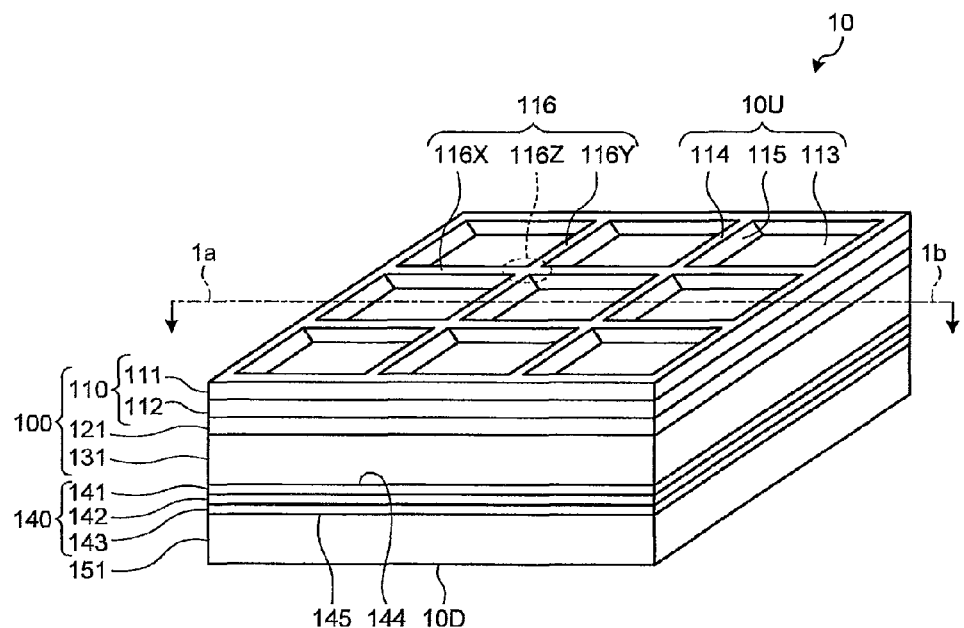
FIG. 1 is a perspective view schematically illustrating a light-emitting device according to a first embodiment of the present invention.
Figure 2:
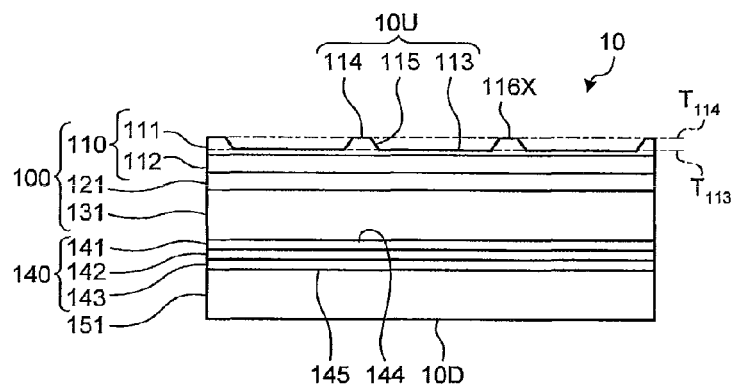
FIG. 2 is a cross-sectional view schematically illustrating a cross section of the light-emitting device according to the first embodiment of the present invention, the cross section being along a plane passing through line 1a-1b shown in FIG. 1 and perpendicular to a light output surface.

FIGS. 1 and 2 are each an explanatory view illustrating a light-emitting device according to a first embodiment of the present invention. FIG. 1 is a perspective view schematically illustrating the light-emitting device. FIG. 2 is a schematic cross-sectional view illustrating the light-emitting device of FIG. 1, the cross section being along a plane passing through line 1a-1b and perpendicular to a light output surface.

As shown in FIG. 1, the light-emitting device 10 according to the first embodiment of the present invention has a rectangular flat-shaped structure and includes an organic EL element 140 of a double-side emission type. The organic EL element 140 includes at least a first transparent electrode layer 141, a light-emitting layer 142, and a second transparent electrode layer 143 provided in this order. Light generated in the light-emitting layer 142 passes through the first electrode layer 141 or the second electrode layer 143, and then is emitted out of surfaces 144 or 145 of the organic EL element.

On at least one surface 144 of the organic EL element 140, a light output surface structure layer 100 is provided. In the present embodiment, the light output surface structure layer 100 is provided to be in direct contact with the surface 144 of the organic EL element 140. However, the light output surface structure layer 100 may also be indirectly provided on the surface 144 of the organic EL element 140, for example, via a layer such as an adhesive layer or a light diffusion layer.

Furthermore, the light-emitting device 10 of this embodiment may also include a component other than the aforementioned members. In this embodiment, a sealing substrate 151 is provided on the surface 145 of the organic EL element 140 located on the lower side in the figure.

Accordingly, the light-emitting device 10 includes the sealing substrate 151, the organic EL element 140, and the light output surface structure layer 100 in this order, and is configured to allow light to exit through a surface 10U of the light output surface structure layer 100 opposite to the organic EL element 140 as well as to allow light to exit through a surface 10D of the sealing substrate 151 opposite to the organic EL element 140. Note that since the surfaces 10U and 10D are located at the outermost positions of the light-emitting device 10 so as to allow light to exit out of the light-emitting device 10 through the surfaces 10U and 10D, the surfaces 10U and 10D may also be referred to as the "light output surface."

[1-1. Organic EL Element]

For example, as illustrated as the organic EL element 140, the organic EL element is usually made up of two or more electrode layers, and a light-emitting layer disposed between these electrode layers so as to emit light upon application of a voltage from the electrode layers.

The organic EL element is usually constructed such that layers, such as the electrode layers and the light-emitting layer which constitute the organic EL element, are formed on a substrate, and a sealing member is provided to cover those layers, whereby the layers such as the light-emitting layer are sealed between the substrate and the sealing member.

There is no limitation on the light-emitting layer. The light-emitting layer may be appropriately chosen from among known ones. The light-emissive material of the light-emitting layer to be employed is not limited to one type, but may be of two or more types combined at any ratio. Furthermore, the light-emitting layer is not limited to one layer, and may be a single layer of one type or a combination of layers of a plurality of types so as to be fit for use as a light source. This allows the light-emitting layer to emit light of white color or a color close thereto.

The electrode layers constituting the organic EL element are each a transparent electrode layer which is formed of a transparent material. As used herein, the expression "being transparent" means having a level of light transmittance that is suitable for use as an optical member. For example, an electrode having a light transmittance that is high enough to allow the light-emitting device 10 as an entire device to have a desired total light transmittance, which will be discussed later, may be employed as a transparent electrode layer. Provision of the transparent electrode layer having a high transparency allows the extraction efficiency of light generated in the light-emitting layer to be enhanced, while allowing an observer to clearly see through the light-emitting device. The transparent electrode layer may be formed of a single material of one type or two or more types of materials combined at any ratio. Furthermore, the transparent electrode layer may have a single-layered structure with only one layer or a multi-layered structure with two or more layers.

In addition to the light-emitting layer 142, the organic EL element 140 may also have another layer (not shown) such as a hole injection layer, a hole transport layer, an electron transport layer, and an electron injection layer between the first transparent electrode layer 141 and the second transparent electrode layer 143. Furthermore, the organic EL element 140 may also include any component such as wiring for applying electricity to the first transparent electrode layer 141 and the second transparent electrode layer 143, and a peripheral structure for sealing the light-emitting layer 142.

The materials for forming the transparent electrode layers and the layers provided therebetween are not limited to a particular one, and specific examples thereof may include the following.

Examples of the material for the transparent electrode layer may include ITO (indium tin oxide).

Examples of the material for the hole injection layer may include a starburst-based aromatic diamine compound.

Examples of the material for the hole transport layer may include a triphenyl diamine derivative.

Examples of the host material for a yellow light-emitting layer may include a triphenyl diamine derivative, while examples of the dopant material for the yellow light-emitting layer may include a tetracene derivative.

Examples of the material for a green light-emitting layer may include a pyrazoline derivative.

Examples of the host material for a blue light-emitting layer may include an anthracene derivative, while examples of the dopant material for the blue light-emitting layer may include a perylene derivative.

Examples of the material for a red light-emitting layer may include a europium complex.

Examples of the material for the electron transport layer may include an aluminum quinoline complex (Alq).

It is also acceptable to appropriately combine the aforementioned light-emitting layers or other light-emitting layers into a light-emitting layer, referred to as a laminated type or tandem type, which emits light in complementary colors. The combination of complementary colors may be, for example, yellow/blue or green/blue/red.

[1-2. Light Output Surface Structure Layer]

The light output surface structure layer 100 is provided on the surface 144 of the organic EL element 140, so that the surface of the light output surface structure layer 100 opposite to the organic EL element 140 is the light output surface 10U. The light output surface 10U is an exposed surface as the outermost surface of the light-emitting device 10 and serves as a light output surface of the light-emitting device 10, i.e., the light output surface through which light exits outwardly from the light-emitting device 10.

When viewed macroscopically, the light output surface 10U is parallel to the surface 144 of the organic EL element 140 and parallel to the principal plane of the light-emitting device 10. However, since the light output surface 10U has a concavo-convex structure when viewed microscopically, part of the surface (in the present embodiment, an inclined surface portion 115) may form a non-parallel angle relative to the surface 144 of the organic EL element 140. As used in the following descriptions, the expression, "being parallel to" or "being perpendicular to" the light output surface means, unless otherwise specified, "to be parallel to" or "to be perpendicular to" the light output surface, respectively, when viewed macroscopically with the concave portion and the convex portion ignored. Furthermore, unless otherwise specified, a description will be made to the light-emitting device 10 with the light output surface 10U placed to be parallel to the horizontal direction and oriented upward.

The light output surface structure layer 100 includes: a multi-layered body 110 which includes a concavo-convex structure layer 111 and a substrate film layer 112; a supporting substrate 131 as a substrate; and an adhesive layer 121 for bonding the multi-layered body 110 and the supporting substrate 131 together.

The concavo-convex structure layer 111 is located on one surface of the light-emitting device 10 (i.e., the outermost layer on one light output surface of the light-emitting device 10; on the upper side in the figure). The light output surface 10U, i.e., the surface of the concavo-convex structure layer 111 has a concavo-convex structure formed thereon. As will be discussed in more detail later, the concavo-convex structure has a flat surface portion (a lower-level flat surface portion) 113 and a flat surface portion (a higher-level flat surface portion) 114, which are parallel to the surface 144 of the organic EL element 140, and the inclined surface portion 115 which is tilted relative to the flat surface portion 113 and the flat surface portion 114. As used herein, the expression, "the inclined surface portion 115 is tilted relative to the flat surface portion 113 and the flat surface portion 114" means that the inclined surface portion 115 is not parallel to the flat surface portions 113 and 114.

More specifically, the concavo-convex structure layer 111 has a grid-shaped convex portion 116 on the light output surface 10U. On the light output surface 10U, the top of the convex portion 116 (i.e., the most protruding portion) is the flat surface portion 114, while the side surface of the convex portion 116 is the inclined surface portion 115. Furthermore, the portion which is not provided with the convex portion 116 on the light output surface 10U is the flat surface portion 113.

[Description of Concavo-Convex Structure]

Figure 3:
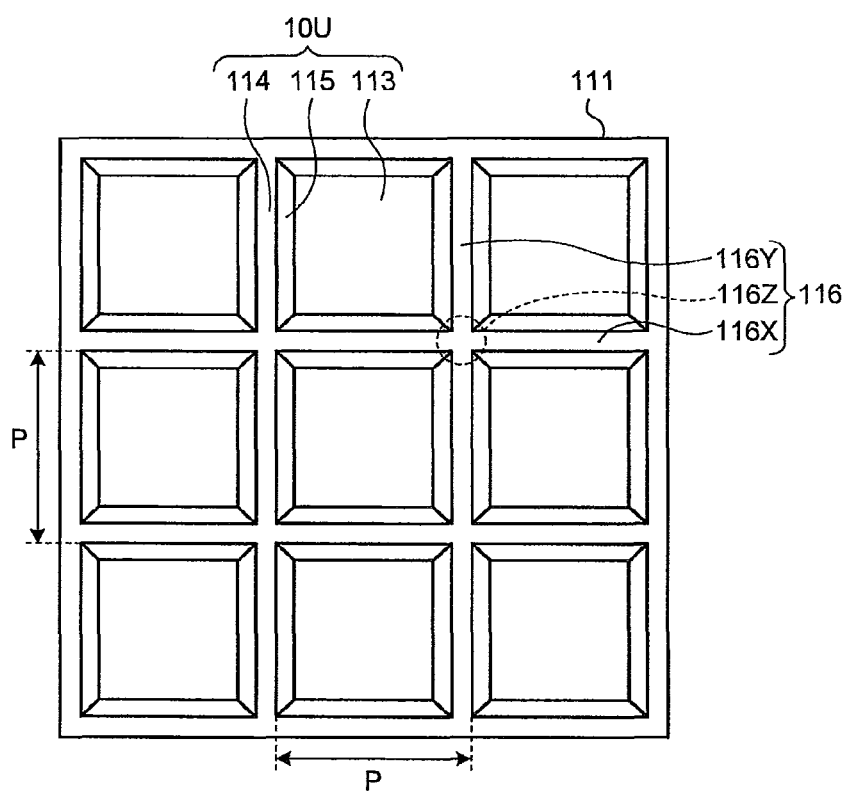
FIG. 3 is an enlarged partial plan view schematically illustrating the light output surface of the light-emitting device according to the first embodiment of the present invention when viewed in the thickness direction of the light-emitting device.
Figure 4:
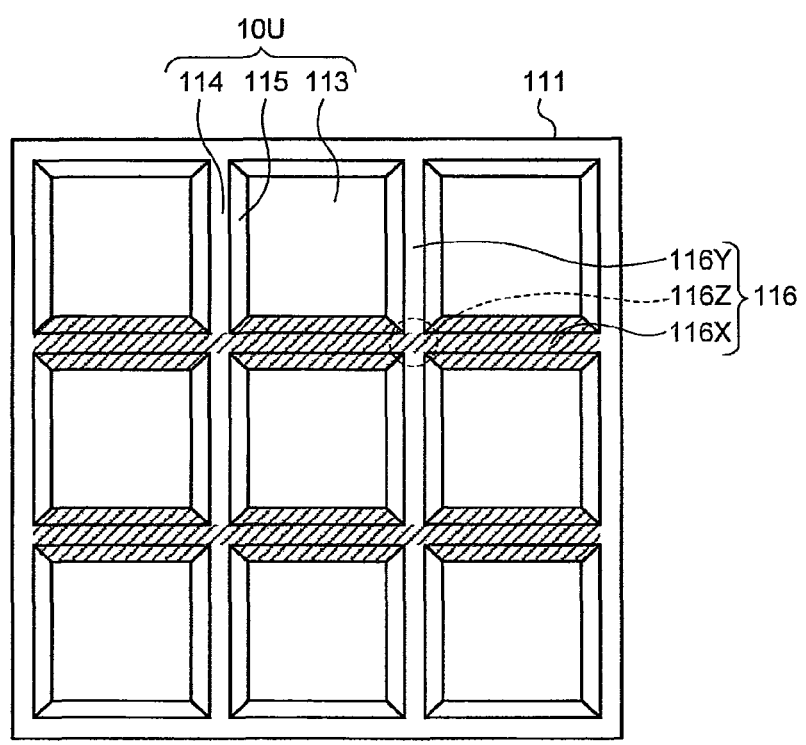
FIG. 4 is an enlarged partial plan view schematically illustrating the light output surface of the light-emitting device according to the first embodiment of the present invention when viewed in the thickness direction of the light-emitting device.
Figure 5:
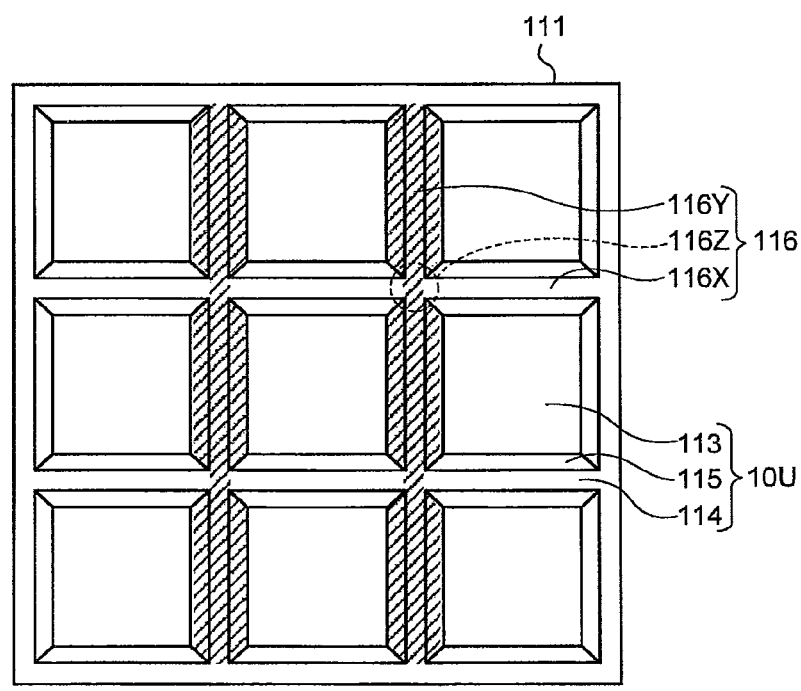
FIG. 5 is an enlarged partial plan view schematically illustrating the light output surface of the light-emitting device according to the first embodiment of the present invention when viewed in the thickness direction of the light-emitting device.

The concavo-convex structure of the light output surface 10U will be described in more detail with reference to the drawings. FIGS. 3 to 5 are each an enlarged partial plan view schematically illustrating the light output surface 10U of the light-emitting device 10 according to the first embodiment of the present invention when viewed in the thickness direction of the light-emitting device 10.

As shown in FIGS. 3 to 5, the concavo-convex structure layer 111 has, on the light output surface 10U, the convex portion 116 which protrudes from the surrounding. The convex portion 116, which is provided in a grid shape when viewed in the thickness direction, includes a group of convex portions 116X extending in one direction within a plane (see the diagonally shaded areas of FIG. 4), and another group of convex portions 116Y extending in a direction within a plane, the direction being perpendicular to the direction in which the convex portions 116X extend (see the diagonally shaded areas of FIG. 5). As to the present embodiment, it is assumed that the direction in which the convex portions 116X extend is parallel to line 1a-1b shown in FIG. 1. These convex portions 116X and 116Y extend continuously for a certain length in the respective directions and intersect each other at a plurality of intersections 116Z.

As shown in FIG. 2, the convex portions 116X and 116Y, excluding the intersections 116Z, have a cross section in a shape of trapezoid (more specifically, an isosceles trapezoid), that is a sort of a quadrangle, when the cross section is along a plane perpendicular to the respective directions in which the convex portions 116X and 116Y extend. The height of these trapezoids is equal to the height of the convex portion 116 and uniform in the respective directions in which the convex portions 116X and the convex portions 116Y extend. Accordingly, the most protruding part of the convex portion 116 constitutes a flat surface portion which is located at a constant level $T_{114}$ in the thickness direction and parallel to the light output surface 10U, and this flat surface portion constitutes the flat surface portion 114. Furthermore, in the cross section obtained by cutting the convex portions 116, the flat surface portion 114 corresponds to the upper bottom of the trapezoid.

The convex portion 116 has a pair of the inclined surface portions 115 corresponding to the opposing sides of the trapezoid which are not parallel to each other in the cross section, and the flat surface portion 114 is configured to be placed between the inclined surface portions 115. As described above, the inclined surface portion 115 is tilted relative to the flat surface portions 113 and 114, and is therefore tilted relative to the light output surface 10U (i.e., a surface formed at an angle not parallel to the light output surface 10U).

The convex portion 116X and the convex portion 116Y are each provided discretely at respective predetermined intervals. Accordingly, the flat surface portion 113 having no convex portion 116 is provided between the convex portions 116X as well as between the convex portions 116Y on the light output surface 10U. In the present embodiment, as shown in FIG. 3, the flat surface portion 113 is provided at a plurality of locations as a rectangular surface portion surrounded by the inclined surface portions 115. As shown in FIG. 2, all of the plurality of flat surface portions 113 are located at the same level $T_{113}$ in the thickness direction. Furthermore, the flat surface portion 113 is parallel to the light output surface 10U, and is therefore parallel to the flat surface 114 as well.

The presence of the concavo-convex structure having the flat surface portions 113 and 114 as well as the inclined surface portion 115 enables the light-emitting device 10 of this embodiment to have a higher light extraction efficiency through the light output surface 10U than that of an instance without the concavo-convex structure. This is because light that otherwise would be internally reflected inside the flat surface portions 113 and 114 and thus could not be extracted can be extracted through the inclined surface portion 115.

Furthermore, the flat surface portions 113 and 114 also reflect, in a variety of directions, the light that is emitted from the organic EL element 140 and then repeatedly reflected until the light is finally extracted into the air, whereby the light extraction efficiency can also be enhanced.

Furthermore, the present embodiment makes it possible to prevent the concavo-convex structure from being chipped due to an external impact, and therefore makes it possible to provide an improved mechanical strength to the light output surface 10U. In general, when an impact is applied to a surface with a concavo-convex structure, part of the concavo-convex structure would tend to be subjected to intensive force and thus easily damaged. However, in the light-emitting device 10 of this embodiment, the level $T_{114}$ of the flat surface portions 114 are made even in the thickness direction. It is thus possible to prevent part of the convex portion 116 from being subjected to intensive force due to an external force or impact applied to the light output surface 10U. It is thus possible to prevent damage to the convex portion 116, allowing a good light extraction efficiency and a high mechanical strength of the light output surface 10U of the light-emitting device 10 to be simultaneously achieved.

Furthermore, the present embodiment makes it possible to prevent dust and chips from being accumulated in the concavo-convex structure. The flat surface portion 113 is surrounded by the convex portions 116 and recessed with respect to the surrounding. Accordingly, when dust particles are adhered to the light-emitting device 10, the dust particles tend to be accumulated in the flat surface portion 113 which constitutes a recess. Dust and chips accumulated in the flat surface portion 113 would possibly cause, for example, degradation in light extraction efficiency and occurrence of bright spots. However, in the present embodiment, the bottom of the recess or the flat surface portion 113 is flat, whereby the dust and chips can be easily expelled, and accumulation of dust and chips can be reduced.

Figure 6:
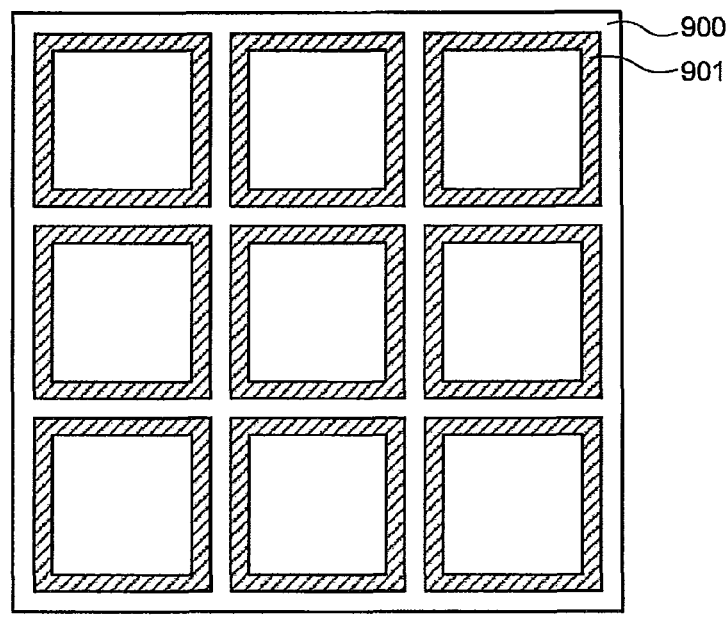
FIG. 6 is a schematic projected view illustrating an inclined surface portion of the light output surface of the light-emitting device according to the first embodiment of the present invention when the inclined surface portion is projected onto a plane parallel to a flat surface portion, the projection being effected in a direction perpendicular to the flat surface portion.

FIG. 6 is a schematic projected view illustrating projected image of the inclined surface portion 115 of the light output surface 10U of the light-emitting device 10, the projection being effected in a direction perpendicular to the flat surface portions 113 and 114, onto a plane 900 that is parallel to the flat surface portions 113 and 114. In the present embodiment, the direction perpendicular to the flat surface portions 113 and 114 is consistent with the thickness direction of the light-emitting device 10. Accordingly, the plane 900 parallel to the flat surface portions 113 and 114 is parallel to the light output surface 10U. However, the plane 900 parallel to the flat surface portions 113 and 114 is not included in the light-emitting device 10, but is a projected plane which is set for measuring the projected area of the inclined surface portion 115. Furthermore, shown in FIG. 6 by being shaded is a projected image 901 obtained by projecting the inclined surface portion 115 of the light output surface 10U of the light-emitting device 10, the projection being effected in a direction perpendicular to the flat surface portions 113 and 114, onto the plane 900 that is parallel to the flat surface portions 113 and 114.

As shown in FIG. 6, for the light-emitting device 10 of the present embodiment, the projected area formed by projecting the inclined surface portion 115, in a direction perpendicular to the flat surface portions 113 and 114, onto the plane 900 parallel to the flat surface portions 113 and 114 is usually 0.1 times the total area of the flat surface portions 113 and 114 or less, preferably 0.05 times or less, and more preferably 0.01 times or less. Furthermore, the lower limit of the ratio of the projected area of the inclined surface portion 115 relative to the total area of the flat surface portions 113 and 114 is usually 0.0001 times or greater, preferably 0.0005 times or greater, and more preferably 0.001 times or greater.

Figure 7:
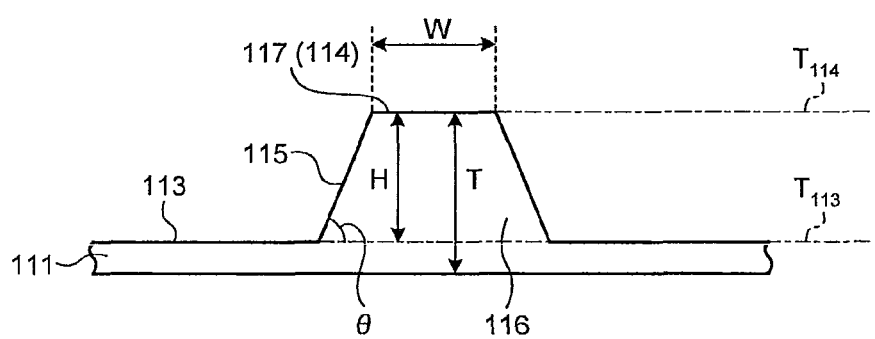
FIG. 7 is an enlarged view schematically illustrating a cross section of a convex portion at other than intersecting portions of a concavo-convex structure layer according to first embodiment of the present invention, wherein the cross section is along a plane parallel to the width direction and the thickness direction of the flat surface portion.

FIG. 7 is an enlarged cross-sectional view schematically illustrating the concavo-convex structure layer 111, when the convex portion 116 at a portion other than the intersections 116Z is cut along a plane parallel to the width direction and the thickness direction of the flat surface portion 114.

In the light-emitting device 10 of the present embodiment, part of the flat surface portion 114 is a specific flat surface portion 117. More specifically, the surface portion of the flat surface portions 114 located at a portion other than the intersections 116Z of the convex portions 116 is the specific flat surface portion 117. The specific flat surface portion 117 is a part of the flat surface portion wherein a ratio H/W is usually one or greater, preferably 1.25 or greater, and more preferably 1.5 or greater, and usually 2.5 or less, preferably 2.25 or less, and more preferably 2.0 or less, wherein W and H are height and width of the flat surface portion, respectively, on a cross section obtained by cutting the light output surface structure layer 100 of that portion along a plane parallel to the width direction and the thickness direction of the flat surface portion.

The specific flat surface portion 117 thus has to be in a protruded shape relative to the surrounding as the precondition of conceptualizing the height H of the specific flat surface portion 117. That the specific flat surface portion 117 "protrudes" means that it protrudes from the surrounding flat surface portions 113 on the light output surface 10U. That is, this means that the specific flat surface portion 117 is located farther away from the organic EL element 140 than the other flat surface portions 113 which are adjacent to the specific flat surface portion 117 via the inclined surface portion 115. Furthermore, the height H of the specific flat surface portion 117 refers to the difference in the thickness direction between the levels (height difference) the specific flat surface portion 117 and the flat surface portion 113 adjacent to the specific flat surface portion 117 via the inclined surface portion 115.

The flat surface portion 114 protruding from the surrounding flat surface portions 113 is not necessarily, in its entirety, the specific flat surface portion 117, but may partially include other portions than the specific flat surface portion 117. In the present embodiment, the intersection 116Z of the convex portions 116X and 116Y which intersect each other does not need to have a ratio H/W of the height H to the width W of the flat surface portion 114 which falls within the aforementioned ranges. However, from the perspective of simultaneously achieving the see-through feature and a high light extraction efficiency, it is particularly preferable that the entirety of the flat surface portion 114 which protrudes from the surrounding flat surface portions 113 is the specific flat surface portion 117.

In the present embodiment, such a structure allows the light-emitting device 10 to be seen through. In general, for an observer to see through the light-emitting device 10, the observer often sees the light-emitting device 10 in a normal direction of the light output surface 10U or in a direction close thereto. Accordingly, from the perspective of achieving the see-through feature, the light to be transmitted through the light-emitting device 10 tends to be at a small incident angle to the light output surface 10U. The flat surface portions 113 and 114 are parallel to the light output surface 10U, and thus tend to easily transmit the light at a small incident angle to the light output surface 10U. Accordingly, the flat surface portions 113 and 114 act to effectively transmit light allowing the light-emitting device 10 to be seen through, thus achieving the see-through feature.

However, when a conventional concavo-convex structure provided on a single-sided light emitting device is applied to the double-sided light emitting device, the light-emitting device cannot be seen therethrough. This is usually because an increase in the ratio of the inclined surface portion leads to a relative decrease in the ratio of the flat surface portion and thus an increase in haze. In contrast to this, when the ratio of the projected area of the inclined surface portion 115 relative to the total area of the flat surface portions 113 and 114 falls within the aforementioned ranges, it is possible to prevent an increase in haze due to the concavo-convex structure when viewed in a direction perpendicular to the light output surface 10U. Thus, according to the light-emitting device 10 of the present embodiment, the see-through feature will not be compromised because an increase in haze can be prevented even in the presence of the concavo-convex structure.

Furthermore, in an instance wherein the ratio of the projected area of the inclined surface portion 115 relative to the total area of the flat surface portions 113 and 114 falls within the aforementioned ranges as mentioned above, when the specific flat surface portion 117 with a ratio H/W of the height H to the width W falling within the aforementioned ranges is present, the light-emitting device 10 of the present embodiment can simultaneously achieve the see-through feature and a high level light extraction efficiency. More specifically, by setting the ratio H/W to not less than the lower limit value of the aforementioned ranges, a high light extraction efficiency can be maintained. On the other hand, by setting the ratio H/W to not more than the upper limit, haze can be suppressed and thereby the see-through feature can be achieved.

The maximum value of the differences between the levels $T_{113}$ and $T_{114}$ of the flat surface portion 113 and the flat surface portion 114 in the thickness direction in the concavo-convex structure of the light output surface 10U is preferably 130 μm or less, more preferably 120 μm or less, and particularly preferably 110 μm or less. Furthermore, the lower limit is usually 5 μm or greater, preferably 7.5 μm or greater, or 10 μm or greater. In the present embodiment, the difference between the levels of the flat surface portion 113 and the flat surface portion 114 in the thickness direction is consistent with the height H of the specific flat surface portion 117. Thus, it is preferable that the maximum height H of the specific flat surface portion 117 also falls within the aforementioned ranges.

By setting the maximum value of the differences between the levels $T_{113}$ and $T_{114}$ of the flat surface portions 113 and 114 in the thickness direction within the aforementioned ranges, the viewer can see through the light-emitting device 10 even when viewed in a tilted direction (oblique direction) relative to the normal direction of the light output surface 10U. A greater area ratio of the inclined surface portion 115 tends to cause an increase in haze when the light output surface 10U is viewed in an oblique direction. In contrast to this, in an instance wherein the ratio of the projected area of the inclined surface portion 115 relative to the total area (entire area) of the flat surface portions 113 and 114 falls within the aforementioned ranges, when the maximum value of the differences between the levels $T_{113}$ and $T_{114}$ of the flat surface portions 113 and 114 in the thickness direction falls within the aforementioned ranges, an increase in haze when viewed in an oblique direction can be suppressed. It is thereby possible not to compromise the see-through feature even when the light-emitting device 10 is viewed in an oblique direction.

Relative to the flat surface portions 113 and 114, the inclined surface portion 115 is preferably tilted at an inclination angle θ, which is usually 80° or greater, preferably 81° or greater, and more preferably 82° or greater, and usually less than 90°, preferably 89° or less, and more preferably 88° or less. That is, the inclined surface portion 115 is not parallel to the flat surface portions 113 and 114, and it is preferable that the angle θ formed between the inclined surface portion 115 and the flat surface portions 113 and 114 falls within the aforementioned ranges. By having such a large inclination angle θ of the inclined surface portion 115, the light extraction efficiency can be enhanced with stability. Furthermore, since a larger inclination angle θ can reduce the projected area per one inclined surface portion 115 when compared with an instance with a smaller inclination angle θ, it is possible to see more clearly through the light-emitting device 10 when viewed in a direction perpendicular to the light output surface 10U. The direction perpendicular to the light output surface 10U is consistent with the front direction of the light-emitting device 10. It is usually expected that the light-emitting device 10 is more often seen through in the front direction, and thus the aforementioned advantage is practically useful.

Furthermore, in the present embodiment, although the inclination angle θ of all the inclined surface portions 115 are set to the same magnitude, it may also be set to different magnitudes without particular limitation.

It is preferable that the thickness T of the concavo-convex structure layer 111 falls within an appropriate range in relation to the maximum value of the differences between the levels $T_{113}$ and $T_{114}$ of the flat surface portions 113 and 114 in the thickness direction. For example, when the concavo-convex structure layer 111 is made of a hard material which advantageously maintains the durability of the concavo-convex structure layer 111, the concavo-convex structure layer 111 having a thin thickness T is capable of providing an enhanced flexibility to the light-emitting device 10. This preferably facilitates the handling of the concavo-convex structure layer 111 in the manufacturing process of the light-emitting device 10. More specifically, the difference between the maximum value of the differences between the levels $T_{113}$ and $T_{114}$ of the flat surface portions 113 and 114 in the thickness direction and the thickness T of the concavo-convex structure layer 111 is preferably 0 to 30 μm. The thickness T of the concavo-convex structure layer 111 is defined as the distance between the surface thereof on the substrate film layer 112 side on which no concavo-convex structure is formed and the flat surface portion 114 of the concavo-convex structure.

As shown in FIG. 3, the light output surface 10U is shaped in such a manner that the structure with the flat surface portions 113 and 114 and the inclined surface portion 115 is repeated in the predetermined directions. The structure is repeated at a pitch P of usually 0.1 μm or greater, preferably 0.15 μm or greater, and more preferably 0.2 μm or greater, and usually 500 μm or less, preferably 450 μm or less, and more preferably 400 μm or less. The pitch P which is set at not less than the lower limit of the ranges makes it possible to provide an enhanced light extraction efficiency. On the other hand, the pitch P set at not more than the upper limit of the ranges makes it possible to provide an enhanced transparency.

[Description of Material for Multi-Layered Body]

The light output surface structure layer 100 can be formed of a plurality of layers, but may also be formed of a single layer. From the perspective of easily manufacturing the light output surface structure layer 100 having desired properties, it is preferable that the layer 100 is formed of a plurality of layers. In the present embodiment, as shown in FIG. 1, the light output surface structure layer 100 includes the multi-layered body 110 having the concavo-convex structure layer 111 and the substrate film layer 112 in combination. This makes it possible to readily provide the light output surface structure layer 100 having a high performance.

The concavo-convex structure layer 111 and the substrate film layer 112 are usually formed of a resin composition containing a transparent resin. As used herein, the expression, "the transparent resin is transparent" means that the transparent resin has an acceptable level of light transmittance for a member to be used as an optical member. In the present embodiment, each layer which constitutes the light output surface structure layer 100 may have a light transmittance which is suitable for use as an optical member, and for example, the light output surface structure layer 100 in its entirety may have a total light transmittance of 80% or greater.

The transparent resin to be employed may be of a variety of types of the resins that can form a transparent layer, without being limited to a particular one. For example, examples of the resin may include a thermoplastic resin, a thermosetting resin, a UV curable resin, and an electron-beam curable resin. Of these types of resins, the thermoplastic resin can be easily deformed with heat and the UV curable resin has high curability and high efficiency. Therefore, these resins are preferred because therewith the concavo-convex structure layer 111 can be efficiently formed.

Examples of the thermoplastic resin may include a polyester-based resin, a polyacrylate-based resin, and a cycloolefin polymer-based resin. Furthermore, examples of the UV curable resin may include an epoxy-based resin, an acrylic-based resin, a urethane-based resin, an ene/thiol-based resin, and an isocyanate-based resin. As these resins, those having a plurality of polymerizable functional groups may be preferably employed. As the resin, one species thereof may be used, or two or more species thereof may be used in combination at any ratio.

Of the resins mentioned above, preferable materials for the concavo-convex structure layer 111 constituting the multi-layered body 110 are those having a high hardness when cured, from the perspective of easily forming the concavo-convex structure of the light output surface 10U and providing the concavo-convex structure with resistance to abrasion. More specifically, the material may preferably have a pencil hardness of HB or greater, more preferably H or greater, and still more preferably 2H or greater, when formed on a substrate as a resin layer having a thickness of 7 μm with no concavo-convex structure. On the other hand, preferable materials for the substrate film layer 112 are those having a certain extent of flexibility so as to facilitate the handling thereof upon formation of the concavo-convex structure layer 111 and the handling of the multi-layered body 110 after the formation of the multi-layered body 110. A combination of these materials can provide the multi-layered body 110 that can be handled easily and has outstanding durability, and as a result, makes it possible to readily manufacture a high-performance light-emitting device 10.

Such a combination of materials can be provided by appropriately selecting transparent resins among those enumerated above as the resins which constitute the respective materials. More specifically, it is preferable to employ, for example, a UV curable resin such as acrylate as the transparent resin that constitutes the material for the concavo-convex structure layer 111, while employing, for example, an alicyclic olefin polymer film (for example, ZEONOR film by ZEON CORPORATION) or polyester film as the transparent resin that constitutes the material for the substrate film layer 112.

As in the present embodiment, when the light output surface structure layer 100 includes the concavo-convex structure layer 111 and the substrate film layer 112, the refractive indices of the concavo-convex structure layer 111 and the substrate film layer 112 may be as close as possible. In this case, the difference in refractive index between the concavo-convex structure layer 111 and the substrate film layer 112 is preferably within 0.1, and more preferably within 0.05.

The material to be used for the layers which serve as a component of the light output surface structure layer 100 such as the concavo-convex structure layer 111 and the substrate film layer 112 may be a material having optical diffusivity within the ranges of not hampering the see-through feature. This makes it possible to diffuse light passing through the light output surface structure layer 100 while maintaining the see-through feature, thereby reducing changes in color tone at different viewing angles.

Examples of the material having optical diffusivity may include materials containing particles and an alloy resin which contains two or more types of resins mixed together so as to diffuse light. Of those materials having optical diffusivity, from the perspective of readily adjusting the optical diffusiveness, materials containing particles are preferable. In particular, a resin composition containing particles is preferable.

The particles may or may not be transparent. Examples of the material of the particles may include metal, a metal compound, and a resin. Examples of the metal compound may include a metal oxide and a metal nitride. Specific examples of the metal and the metal compound may include a highly reflective metal such as silver or aluminum; and a metal compound such as silicon dioxide, aluminum oxide, zirconium oxide, silicon nitride, tin-doped indium oxide, and titanium oxide. On the other hand, examples of the resin may include a methacrylic resin, a polyurethane resin, and a silicone resin. As the material of particles, one species thereof may be solely used, or two or more species thereof may be used in combination at any ratio.

The shape of particles may be, for example, a spherical shape, a cylindrical shape, an acicular shape, a cubic shape, a rectangular shape, a pyramid shape, a conical shape, and a star shape.

The particle diameter of particles may be preferably 0.1 μm or greater, and preferably 10 μm or less and more preferably 5 μm or less. As used herein, the particle diameter is defined as the 50% particle diameter in a cumulative distribution which is obtained by adding up the amount of particles measured by volume along the horizontal axis representative of the particle diameter. The larger the particle diameter is, the greater the containing ratio of the particles necessary to obtain the desired effect is. The smaller the particle diameter is, the smaller the necessary containing ratio is. Accordingly, smaller particle diameter results in obtaining desired effects such as a decrease in color tone change depending on viewing angles and an improvement in light extraction efficiency with a smaller amount of particles. For a particle having a shape other than a spherical one, the particle diameter of the particle is defined as the diameter of the sphere that has the same volume as that of the particle.

When particles are transparent and contained in a transparent resin, the difference in refractive index between the particle and the transparent resin is preferably 0.05 to 0.5, and more preferably 0.07 to 0.5. Any one of the refractive index of the particle and the refractive index of the transparent resin may be greater than the other. By setting the difference in refractive index between the particle and the transparent resin to not less than the lower limit of the aforementioned ranges, change in color tone at different viewing angles can be effectively prevented. By setting the difference in refractive index to not more than the upper limit, the light extraction effect can be enhanced.

The containing ratio of particles in volume ratio relative to the total volume of the layer that includes the particles is preferably 1% or greater and more preferably 5% or greater, and preferably 80% or less and more preferably 50% or less. By setting the containing ratio of particles to not less than the lower limit, desired effects such as reductions in change in color tone at different viewing angles can be achieved. Furthermore, by setting the containing ratio of particles to not more than the upper limit, aggregation of particles can be prevented and stable dispersion of the particles can be achieved.

Furthermore, if necessary, the resin composition may contain an optional component. Examples of the optional component may include additives such as deterioration inhibitors such as phenol-based or amine-based deterioration inhibitors, antistatic agents such as surface active agent based or siloxane based antistatic agents, and light resistant agents such as triazole-based or 2-hydroxy-benzophenone-based light resistant agents.

Although not particularly limited thereto, the thickness T of the concavo-convex structure layer 111 (see FIG. 7) is preferably 1 μm to 70 μm.

On the other hand, the thickness of the substrate film layer 112 is preferably 20 μm to 300 μm.

[Supporting Substrate]

The light-emitting device 10 of the present embodiment includes the supporting substrate 131 between the organic EL element 140 and the multi-layered body 110. The provision of the supporting substrate 131 can give rigidity for suppressing deflection to the light-emitting device 10. The supporting substrate 131 to be provided may be a substrate having an outstanding capability of sealing the organic EL element 140 and an capability of allowing sequential formation thereon of the layers which constitute the organic EL element 140 in the manufacturing process. This makes it possible to improve durability of the light-emitting device 10 and to facilitate the manufacture thereof.

The material to be employed for forming the supporting substrate 131 is usually a transparent material. Examples of the material may include glass and resin. As the material for the supporting substrate 131, one species may be solely used, or two or more species may also be used in combination at any ratio.

The refractive index of the supporting substrate 131 is preferably 1.4 to 2.0, though not particularly limited thereto.

The thickness of the supporting substrate 131 is preferably 0.1 mm to 5 mm, though not particularly limited thereto.

[Adhesive Layer]

The light-emitting device 10 of the present embodiment includes an adhesive layer 121 between the multi-layered body 110 and the supporting substrate 131. The adhesive layer 121 is interposed between the substrate film layer 112 of the multi-layered body 110 and the supporting substrate 131 in order to bond these two layers together.

The adhesive, i.e., the material for the adhesive layer 121 may include not only an adhesive in a strict sense (with a shear storage elastic modulus of 1 to 500 MPa at 23° C., showing no adhesion at room temperatures, i.e., a so-called hot-melt adhesive) but also an adhesive which has a shear storage elastic modulus of less than 1 MPa at 23° C. More specifically, the adhesive to be appropriately employed may have a refractive index close to that of the supporting substrate 131 or the substrate film layer 112 and may be transparent. Specific examples of the adhesive may include an acrylic-based adhesive or tackiness agent. The thickness of the adhesive layer is preferably 5 µm to 100 µm.

[1-3. Sealing Substrate]

The light-emitting device 10 of the present embodiment includes a sealing substrate 151 on the surface 145 of the organic EL element. The sealing substrate 151 may be brought into direct contact with the surface 145 of the organic EL element. Alternatively, between the surface 145 of the organic EL element and the sealing substrate 151, there may exist any substance such as a filler or an adhesive, or a gap. In the gap, there may exist air or other gases so long as no disadvantage is caused, for example, unless the durability of the light-emitting layer 142 is not seriously compromised. Alternatively, the gap may be in vacuo.

As the sealing substrate 151, any member that can seal the organic EL element 140 and can transmit light that has come out of the surface 145 may be employed. For example, it is possible to employ the same material as that of the supporting substrate 131.

[1-4. Manufacturing Method]

Although not particularly limited thereto, the light-emitting device 10 may be manufactured by:

a step of depositing each layer forming the organic EL element 140 on one surface of the supporting substrate 131;

a step of preparing the multi-layered body 110 having the concavo-convex structure layer 111 and the substrate film layer 112;

a step of adhering the resulting multi-layered body 110 to the other surface of the supporting substrate 131 via the adhesive layer 121; and a step of providing the sealing substrate 151 on the surface of the organic EL element 140 that is opposite to the supporting substrate 131. Each of the steps mentioned above is not limited to a particular order so long as a desired light-emitting device 10 can be obtained.

The multi-layered body 110 having the concavo-convex structure layer 111 and the substrate film layer 112 may be manufactured, for example, by preparing a mold such as a metal molding having a desired shape, and then transferring the mold to a material layer which forms the concavo-convex structure layer 111. Example of a more specific method therefor may include the following:

[Method 1] Preparing an unworked multi-layered body which has a layer of a resin composition A for constituting the substrate film layer 112 and a layer of a resin composition B for constituting the concavo-convex structure layer 111 (with the concavo-convex structure not yet formed), and then forming the concavo-convex structure on the resin composition B side of the unworked multi-layered body; and

[Method 2] Applying a liquid state resin composition B onto the substrate film layer 112, putting a mold on the layer of the applied resin composition B, and then curing the resin composition B with the mold keeping in that state, to form the concavo-convex structure layer 111.

In Method 1, the unworked multi-layered body may be obtained, for example, by extrusion in which the resin composition A and the resin composition B are co-extruded. The concavo-convex structure may be formed by pushing with pressure a mold having a desired surface shape against the resin composition B side of the unworked multi-layered body.

More specifically, an elongated unworked multi-layered body is formed continuously by extrusion, and then the unworked multi-layered body is pressed with a transfer roll having a desired surface shape and a nip roll, to thereby perform the continuous manufacturing with efficiency. The nip pressure applied by the transfer roll and the nip roll is preferably a few MPa to tens of MPa. The temperature at the time of transfer is preferably not less than Tg and not greater than (Tg+100° C.), where Tg is the glass transition temperature of the resin composition B. The duration of contact between the unworked multi-layered body and the transfer roll may be adjusted by the feed speed of the film, i.e., the rotational speed of the roll, and is preferably not less than 5 seconds and not more than 600 seconds.

In Method 2, as the resin composition B for forming the concavo-convex structure layer 111, it is preferable to use a composition which can be cured by energy radiation such as ultraviolet radiation. Such a resin composition B is applied onto the substrate film layer 112, and then a mold is put thereon. Keeping that state, the resin composition B is cured by being irradiated with energy radiation such as ultraviolet radiation from a light source located at the backside of the coated surface (that is, opposite to the surface of the substrate film layer on which the resin composition B has been coated). After that, the mold is removed, to thereby obtain the multi-layered body 110 with the coating of the resin composition B formed as the concavo-convex structure layer 111.

[1-5. Description of Major Advantages]

As the light-emitting device 10 of the present embodiment is configured as described above, light generated in the light-emitting layer 142 of the organic EL element 140 passes through the first transparent electrode layer 141 and the light output surface structure layer 100 so as to be extracted through the light output surface 10U. Light also passes through the second transparent electrode layer 143 and the sealing substrate 151 so as to be extracted through the light output surface 10D. In this instance, since the light output surface 10U has the concavo-convex structure having the flat surface portions 113 and 114 as well as the inclined surface portion 115, the light can be extracted from the light output surface 10U with high efficiency. Furthermore, an appropriate setting of the ratio H/W between the height H and the width W of the specific flat surface portion 117 can remarkably enhance the light extraction efficiency.

Furthermore, since all the layers included in the light-emitting device 10 are transparent, the light-emitting device 10 is configured such that light incident on one light output surface 10U can pass through the light-emitting device 10 and then exit from the other light output surface 10D, whereas light incident on the other light output surface 10D can also pass through the light-emitting device 10 and then exit from the one light output surface 10U. In this instance, haze is suppressed in the present embodiment since the ratio of the projected area of the inclined surface portion 115 relative to the total area of the flat surface portions 113 and 114 is restricted within a predetermined range and the ratio H/W between the height H and the width W of the specific flat surface portion 117 is appropriately set. It is thus possible for viewer's naked eye to clearly see through the light-emitting device 10. Therefore it is possible to realize a see-through type light-emitting device.

More specifically, the light-emitting device 10 has, as the entire light-emitting device 10, a total light transmittance of usually 60% or higher, preferably 70% or higher, and more preferably 80% or higher. The upper limit is ideally 100%; however, usually 90% or lower.

Furthermore, the light-emitting device 10 has, as the entire light-emitting device 10, as small a haze as of usually 10% or lower, preferably 5% or lower, and more preferably 1% or lower. The lower limit value is ideally zero, but usually 0.1% or higher.

[2. Second Embodiment]

In the light output surface 10U according to the first embodiment, the levels $T_{113}$ and $T_{114}$ of the flat surface portions 113 and 114 in the thickness direction are each constant, and therefore, the difference between the levels $T_{113}$ and $T_{114}$ of the flat surface portion 113 and the flat surface portion 114 in the thickness direction is constant. However, in the light-emitting device of the present invention, for example, the flat surface portions may be provided at three or more different levels in the thickness direction, so that the differences between the levels of the flat surface portions in the thickness direction are nonuniform.

Figure 8:
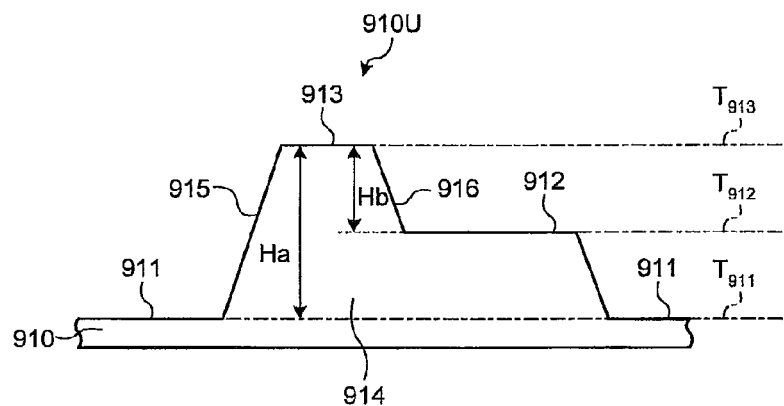
FIG. 8 is an enlarged view schematically illustrating an example of a cross section of a concavo-convex structure layer with flat surface portions provided at three or more different levels in the thickness direction on the light output surface.

FIG. 8 is an enlarged view schematically illustrating an example of a cross section of a concavo-convex structure layer 910 on which flat surface portions 911, 912, and 913 are provided at three or more different levels $T_{911}$, $T_{912}$, and $T_{913}$, respectively, in the thickness direction on a light output surface 910U. FIG. 8 illustrates a cross section of the concavo-convex structure layer 910 which is cut along a plane parallel to the width direction and the thickness direction of the flat surface portions 912 and 913. For example, as shown in FIG. 8, when a convex portion 914 having the two flat surface portions 912 and 913 is formed on a flat surface portion 911, the levels $T_{911}$, $T_{912}$, and $T_{913}$ of these flat surface portions 911, 912, and 913 in the thickness direction are different from each other. The concavo-convex structure layer 910 having the flat surface portions 911, 912, and 913 in this manner at three or more different levels $T_{911}$, $T_{912}$, and $T_{913}$ in the thickness direction is configured such that the difference between the levels of the flat surface portion 911 and the flat surface portion 912 in the thickness direction (i.e., the distance from the level $T_{911}$ to the level $T_{912}$) is different from the difference between the levels of the flat surface portion 911 and the flat surface portion 913 in the thickness direction (i.e., the distance from the level $T_{911}$ to level $T_{913}$). Accordingly, the differences between the levels $T_{911}$, $T_{912}$, and $T_{913}$ of the flat surface portions 911, 912, and 913 in the thickness direction are not uniform.

When the flat surface portions 911, 912, and 913 are provided in this manner at three or more different levels $T_{911}$, $T_{912}$, and $T_{913}$ in the thickness direction, the height H of the specific flat surface portion is determined as follows. For example, when the flat surface portion 913 is the specific flat surface portion, the height H thereof may include (a) a height Ha which is the difference in the thickness direction between the levels $T_{911}$ and $T_{913}$ of the flat surface portion 913 and the flat surface portion 911 adjacent to that flat surface portion 913 via an inclined surface portion 915, and (b) a height Hb which is the difference in the thickness direction between the levels $T_{912}$ and $T_{913}$ of the flat surface portion 913 and the flat surface portion 912 adjacent to that flat surface portion 913 via an inclined surface portion 916. In this case, when the ratio H/W falls within the aforementioned range (i.e., 1 or greater and 2.5 or less) with the postulation that at least one of or preferably both the height Ha and the height Hb are the height H, the flat surface portion 913 is recognized as the specific flat surface portion.

Furthermore, when the flat surface portions 911, 912, and 913 are provided at three or more different levels $T_{911}$, $T_{912}$, and $T_{913}$ in the thickness direction, it is preferable that the difference between every two of the levels $T_{911}$, $T_{912}$, and $T_{913}$ of the flat surface portions 911, 912, and 913 in the thickness direction are 0.1 μm or greater. In the example shown in FIG. 8, it is preferable that the difference between the level $T_{911}$ and the level $T_{912}$, the difference between the level $T_{911}$ and the level $T_{913}$, and the difference between the level $T_{912}$ and the level $T_{913}$ are each 0.1 μm or greater.

When the flat surface portions 911, 912, and 913 of the light output surface 910U are provided at three or more levels or the levels $T_{911}$, $T_{912}$, and $T_{913}$ which are different from each other by 0.1 μm or greater in the thickness direction, the concavo-convex structure of the light output surface 910U is to have a size difference which exceeds the difference that causes the interference of one of or both the light exiting from the light output surface 910U (outgoing light) and the light reflected on the light output surface 910U (reflected light). This can effectively suppress rainbow unevenness caused by the interference of one of or both the outgoing light and the reflected light. As used herein, the term, "rainbow unevenness" refers to rainbow-like unevenness in color which are observed when the light output surface 910U is viewed. The outgoing light passing outwardly through the light output surface 910U includes not only the light that is generated in the light-emitting layer of the organic EL element, but also the light which passes through the light output surface into the light-emitting device and is then reflected inside the light-emitting device so as to exit back from the light output surface. Also included is the light which passes through the other light output surface opposite to the aforementioned light output surface into the light-emitting device and then goes out passing through the light-emitting device (transmitted light).

The difference between the levels $T_{911}$, $T_{912}$, and $T_{913}$ of the flat surface portions 911, 912, and 913 in the thickness direction may be, for example, 0.15 μm or greater or 0.2 μm or greater as well as 0.1 μm or greater. Furthermore, although not particularly limited thereto, the upper limit of the differences between the levels $T_{911}$, $T_{912}$, and $T_{913}$ of the flat surface portions 911, 912, and 913 in the thickness direction is preferably 50 μm or less, and may be, for example, 25 μm or less or 10 μm or less because an excessive increase in the level difference tends to cause an increase in the thickness of the light-emitting device.

Now, referring to the drawing, a description will be made to an example in which flat surface portions are provided at three or more different levels in the thickness direction.

Figure 9:
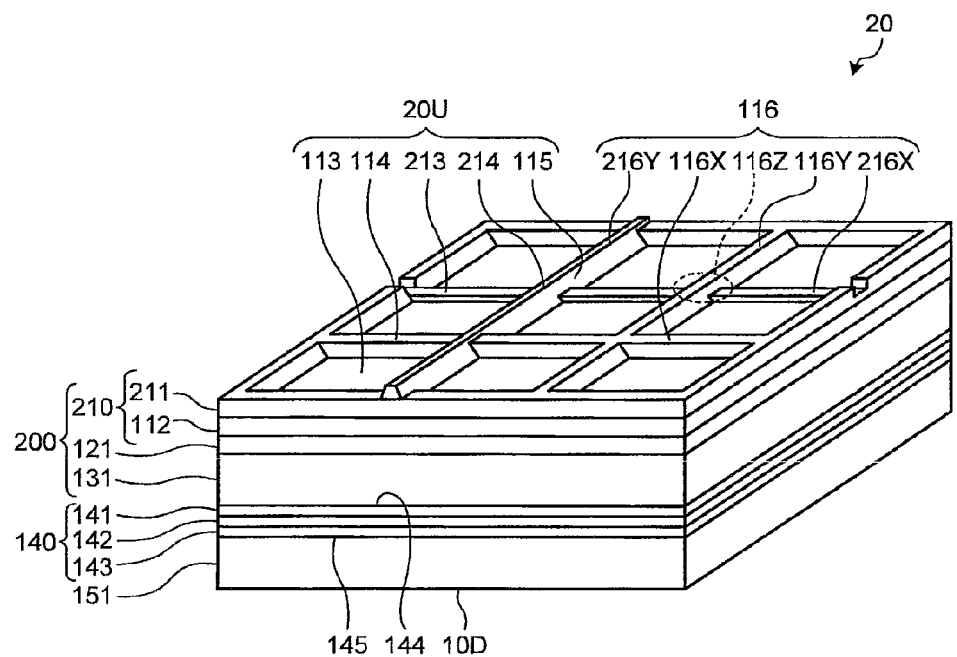
FIG. 9 is a perspective view schematically illustrating a light-emitting device according to a second embodiment of the present invention.

FIG. 9 is a perspective view schematically illustrating a light-emitting device according to a second embodiment of the present invention.

As shown in FIG. 9, a light-emitting device 20 according to the second embodiment of the present invention is the same as the light-emitting device 10 according to the first embodiment except that the device has a concavo-convex structure layer 211 in place of the concavo-convex structure layer 111. That is, the light-emitting device 20 according to the second embodiment has the same structure as the light-emitting device of the first embodiment except that, in a multi-layered body 210 constituting a light output surface structure layer 200, a light output surface 20U that is a surface of the concavo-convex structure layer 211 has a different shape.

The concavo-convex structure layer 211 is the same as the concavo-convex structure layer 111 according to the first embodiment except that the convex portion 116 has nonuniform heights. More specifically, among a group of convex portions 116X extending in a certain direction, a convex portion 216X that is a part of that group has low height. Among another group of convex portions 116Y, a convex portion 216Y that is a part of that group has high height. In this case, the levels of flat surface portions 213 and 214, in the thickness direction, on top of the convex portions 216X and 216Y are different from the levels of the flat surface portions 113 and 114 in the thickness direction. Accordingly, the light output surface 20U is to have the flat surface portions 113, 114, 213, and 214 at four different levels in the thickness direction.

In this instance, the difference between the levels of the flat surface portion 113 and the flat surface portion 213 in the thickness direction is the height of the convex portion 216X. On the other hand, the difference between the levels of the flat surface portion 113 and the flat surface portion 214 in the thickness direction is the height of the convex portion 216Y. Furthermore, the difference in the thickness direction between the levels of the flat surface portion 113 and the flat surface portions 116X and 116Y that are other than the flat surface portions 213 and 214 is the height of the convex portions 116X and 116Y that are other than the convex portions 216X and 216Y. When the difference between the heights of these convex portions 116X, 116Y, 216X, and 216Y has a size difference which exceeds the difference that causes the interference of one of or both the outgoing light and the reflected light, color unevenness due to the interference can be prevented. That is, the interference of the outgoing light and the reflected light is prevented on the flat surface portions 113, 114, 213, and 214 which are located at different levels in the thickness direction, whereby rainbow unevenness can be effectively prevented. In this instance, the size difference exerts its effects by exceeding the difference that causes the interference of the outgoing light. However, since the reflected light rather than the outgoing light usually tends to have more serious influences on rainbow unevenness, remarkable effects are exerted when the size difference exceeds the difference that causes the interference of the reflected light.

Taking an example of the interference of light that is generated in the light-emitting layer 142 of the organic EL element 140, the size difference exceeding the difference that causes the interference is, for example, usually 0.62 times the center wavelength of the light or greater, and preferably 1.5 times or greater. The provision of the size difference makes it possible to prevent the generation of rainbow unevenness. Although not particularly limited thereto, the upper limit of the size difference is preferably 60 times the center wavelength of the light or less.

The aforementioned numerical range was confirmed based on the findings that will be discussed hereinbelow. That is, in a concavo-convex structure layer designed in a manner such that all the heights of the convex portions are aligned to provide a uniform difference between the levels of the flat surface portions in the thickness direction, an error of 170 nm or greater in the difference between the levels of the flat surface portions in the thickness direction may cause interference and rainbow unevenness. It has been found out that, in this case, occurrence of rainbow unevenness can be prevented by intentionally providing the difference between the levels of the flat surface portions in the thickness direction with a size difference which is a height twice or greater the minimum value of errors that cause the rainbow unevenness. Further, in a concavo-convex structure layer designed in a manner such that the differences between the levels of the flat surface portions in the thickness direction are uniform, a variation in terms of a standard deviation σ1 nm (approximately equal to 60 nm) in the differences in the thickness direction between the levels of the flat surface portions may cause interference and rainbow unevenness. In this case, it has been found out that occurrence of rainbow unevenness can be prevented by intentionally providing the difference between the levels of the flat surface portions in the thickness direction with a size difference which is 6×σ1 nm (=360 nm) or greater. The aforementioned two findings can show that the size difference exceeding the difference that causes the interference of the outgoing light is 0.62 times or greater the center wavelength of the light emitted by the light-emitting device.

Furthermore, from the same reason, the size difference exceeding the difference that may cause the interference of the transmitted light and the reflected light is usually 0.62 times or greater the center wavelength of the transmitted light and the reflected light, preferably 1.5 times or greater, and usually 60 times or less. However, since the transmitted light and the reflected light is usually natural light and thus includes arbitrary wavelengths, it is difficult to determine the center wavelength of the reflected light. Thus, in view of the fact that the light that causes the rainbow unevenness is visible light, the wavelength of 550 nm that is the center wavelength of visible light may be usually employed as the center wavelength of the reflected light for setting the aforementioned size difference.

As in the first embodiment, when all the differences between the levels of the flat surface portions in the thickness direction are uniform, the rainbow unevenness caused by interference is hard to occur. However, due to changes in manufacturing conditions such as temperature and humidity, it may be difficult to manufacture the actual products as designed regarding all sizes. In this context, the rainbow unevenness can be prevented more easily by intentionally providing the flat surface portions at three or more different levels in the thickness direction as described above.

The same effects can be obtained even when the aforementioned size difference is provided for a factor other than the difference between the levels of the flat surface portions in the thickness direction. For example, if one or more of a group of factors such as the difference between the levels of the flat surface portions in the thickness direction, the width of the flat surface portions, and the pitch of the flat surface portions, have the aforementioned size difference, then the rainbow unevenness can be prevented in the same manner.

Furthermore, the light-emitting device 20 according to the second embodiment of the present invention is configured such that the ratio of the projected area of the inclined surface portion 115 relative to the total area of the flat surface portions 113, 114, 213, and 214 falls within a predetermined range. Furthermore, the flat surface portions 114, 213, and 214 on top of the convex portion 116 are a specific flat surface portion having a ratio H/W of the height H to the width W which falls within a desired range. It is thus possible to implement the see-through feature and enhance the light extraction efficiency at the same time.

Furthermore, the light-emitting device 20 according to the second embodiment of the present invention can provide the same advantages as those provided by the light-emitting device 10 according to the first embodiment.

[3. Third Embodiment]

In the first and second embodiments, the convex portion 116 was configured to include the two groups of convex portions 116X and 116Y which extend in two directions perpendicular to each other; however, the convex portion 116 may also include only one group of convex portions extending in one direction or three or more groups of convex portions extending in three or more directions. Furthermore, the direction in which the convex portions extend may be arranged in a random fashion. Now, an example thereof will be described with reference to the drawing.

Figure 10:
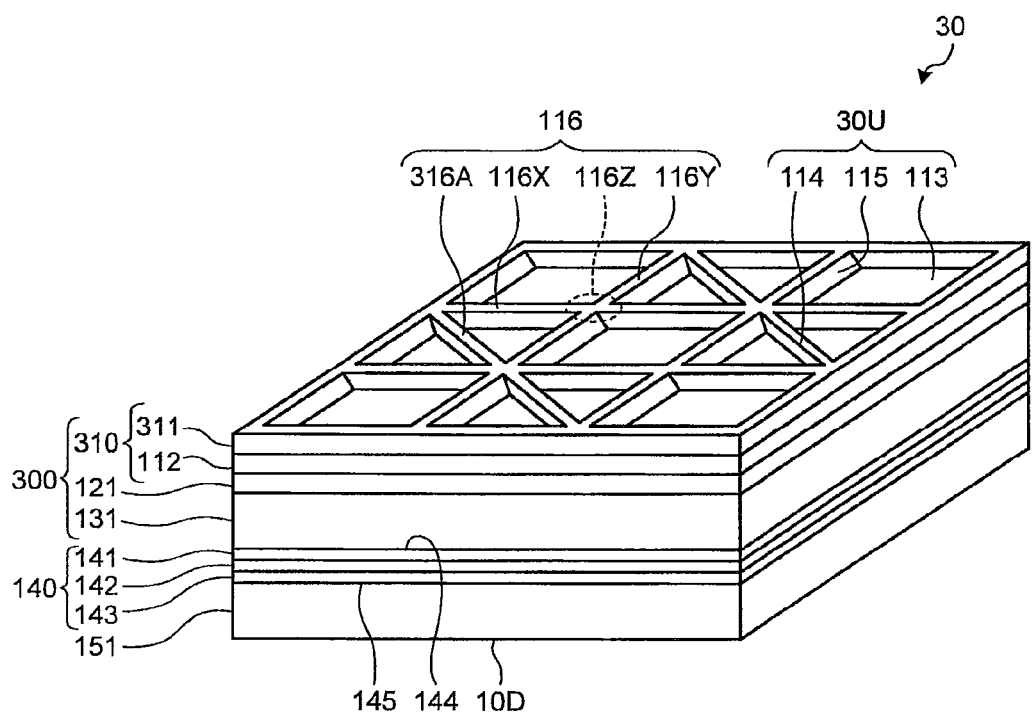
FIG. 10 is a perspective view schematically illustrating a light-emitting device according to a third embodiment of the present invention.

FIG. 10 is a perspective view schematically illustrating a light-emitting device according to a third embodiment of the present invention.

As shown in FIG. 10, the light-emitting device 30 according to the third embodiment of the present invention is the same as the light-emitting device 10 according to the first embodiment except that the device has a concavo-convex structure layer 311 in place of the concavo-convex structure layer 111. That is, the light-emitting device 30 according to the third embodiment is configured in the same manner as the light-emitting device of the first embodiment except that, in a multi-layered body 310 constituting a light output surface structure layer 300, a light output surface 30U that is a surface of the concavo-convex structure layer 311 has a different shape.

The concavo-convex structure layer 311 is the same as the concavo-convex structure layer 111 according to the first embodiment except that the convex portion 116 includes, in addition to a group of the convex portions 116X and another group of the convex portions 116Y, still another group of convex portions 316A. The convex portions 316A are the same as the convex portions 116X and 116Y except the directions in which the convex portions extend. Accordingly, the light output surface 30U has three or more groups of convex portions 116X, 116Y, and 316A which extend in different directions.

The presence of three or more groups of convex portions 116X, 116Y, and 316A which extend in different directions can usually prevent streaks of each of the convex portions 116X, 116Y, and 316A from being visually recognized when the light-emitting device 30 is observed. The streaks of the convex portions refer to those that are visually recognized along the directions in which the convex portions extend when the light output surface is observed at an oblique inclination angle relative to the light output surface.

Furthermore, the presence of three or more groups of convex portions 116X, 116Y, and 316A which extend in different directions can usually reduce variations in view depending on the azimuth angle at which the observer looks at the light-emitting device 30 when the light-emitting device 30 is observed. As used herein, the term "variations in view" refers to the phenomenon in which a change in the azimuth angle at which the observer looks at the light-emitting device causes a change in view such as the color and brightness of the light output surface of the light-emitting device, thus resulting in a significant variation in the view of the light-emitting device depending on the position of the user.

At least three groups of arrays produce these effects, but it is thought that the larger the number of arrays, the more the effects become remarkable. It is thus more preferable to provide four or more groups of arrays than to provide three groups of arrays. Furthermore, since an excessively larger number of groups of arrays will not be required for obtaining sufficient effects, eight or less groups of arrays may usually be provided.

Furthermore, the light-emitting device 30 according to the third embodiment of the present invention is configured such that the ratio of the ratio of the projected area of the inclined surface portion 115 relative to the total area of the flat surface portions 113 and 114 falls within a predetermined range. Furthermore, the flat surface portion 114 on top of the convex portion 116 is the specific flat surface portion having a ratio H/W of the height H to the width W which falls within a desired range. It is thus possible to implement the see-through feature and enhance the light extraction efficiency at the same time.

Furthermore, the light-emitting device 30 according to the third embodiment of the present invention can provide the same advantages as those provided by the light-emitting device 10 according to the first embodiment.

[4. Fourth Embodiment]

The first to third embodiments are configured to dispose the light output surface structure layer on one of the two surfaces of the light-emitting device. However, the light output surface structure layer may also be disposed on both the surfaces. Now, an example thereof will be described with reference to the drawing.

Figure 11:
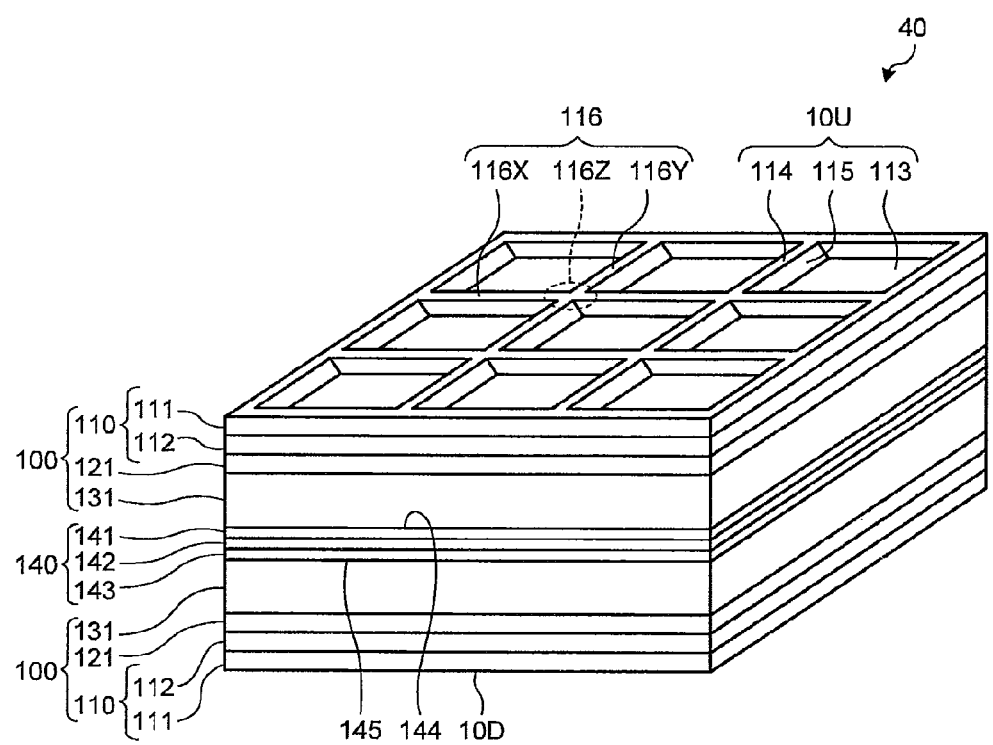
FIG. 11 is a perspective view schematically illustrating a light-emitting device according to a fourth embodiment of the present invention.

FIG. 11 is a perspective view schematically illustrating a light-emitting device according to a fourth embodiment of the present invention.

As shown in FIG. 11, the light-emitting device 40 according to the fourth embodiment of the present invention is the same as the light-emitting device 10 according to the first embodiment except that the device has the light output surface structure layer 100 in place of the sealing substrate 151. Thus, the light-emitting device 40 is to include the light output surface structure layer 100 on both the two surfaces 144 and 145 of the organic EL element 140.

With the light-emitting device 40 having such a configuration, the light generated in the light-emitting layer 142 of the organic EL element 140 is extracted through both the light output surface 10U and the light output surface 10D. In this instance, it is possible to enhance the light extraction efficiency on both the light output surfaces 10U and 10D, and it is also possible to provide the see-through feature to the light-emitting device 40.

Furthermore, the light-emitting device 40 according to the fourth embodiment of the present invention can provide the same advantages as those provided by the light-emitting device 10 according to the first embodiment.

[5. Others]

While the embodiments of the present invention have been described above, the present invention is not limited to the aforementioned embodiments, and the embodiments may also be modified for implementation.

For example, the aforementioned embodiments may be implemented in any combination.

For example, although in the aforementioned embodiments, the concavo-convex structure is formed with grid-shaped convex portions wherein a plurality of groups of extending convex portions are combined together, the concavo-convex structure may also be formed with a structure other than this one. Now, an example thereof will be described with referring to the drawings.

Figure 12:
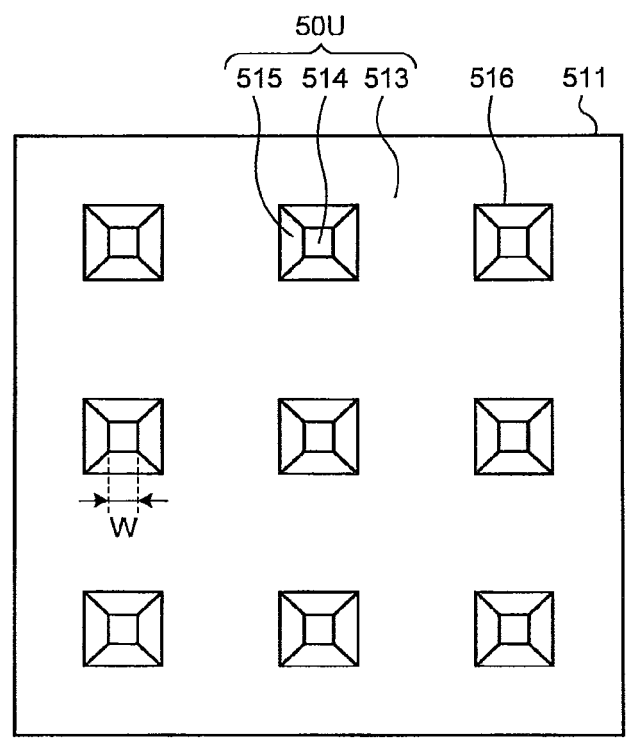
FIG. 12 is an enlarged partial plan view schematically illustrating a concavo-convex structure layer of a light-emitting device according to an example of the present invention when viewed in the thickness direction.
Figure 13:
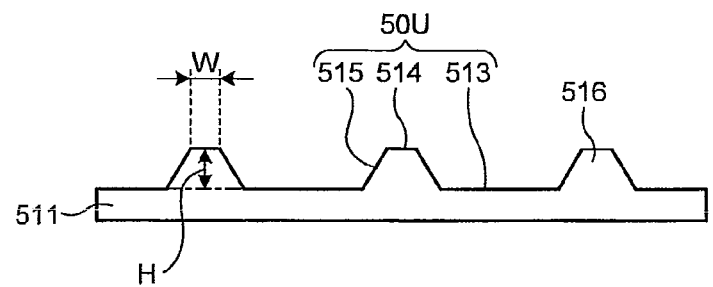
FIG. 13 is an enlarged view schematically illustrating a cross section of a concavo-convex structure layer of a light-emitting device according to an example of the present invention, wherein the cross section is along a plane parallel to the width direction and the thickness direction of a specific flat surface portion.

FIG. 12 is an enlarged partial plan view schematically illustrating a concavo-convex structure layer of a light-emitting device according to an example of the present invention when viewed in the thickness direction. FIG. 13 is an enlarged view schematically illustrating a cross section of the concavo-convex structure layer of the light-emitting device according to the example of the present invention, wherein the cross section is along a plane parallel to the width direction and the thickness direction of a specific flat surface portion. For example, as shown in FIG. 12, on a light output surface 50U of the concavo-convex structure layer 511, convex portions 516 in a prismoidal shape (the shape of a pyramid with its top truncated in parallel to its bottom) may be provided discretely for forming the concavo-convex structure. In this instance, the bottom of the prismoidal shape may be polygonal, for example, triangular, quadrangular, pentagonal, or hexagonal. In this case, the concavo-convex structure is formed of a flat surface portion 513 around the convex portion 516, a flat surface portion 514 on top of the convex portion 516, and an inclined surface portion 515 that is a side surface of the convex portion 516. In such a structure, the flat surface portion 514 is the specific flat surface portion having a ratio H/W of the height H to the width W, the ratio being adapted to fall within the aforementioned range (i.e., 1 or greater and 2.5 or less), as shown in FIG. 13.

Figure 14:
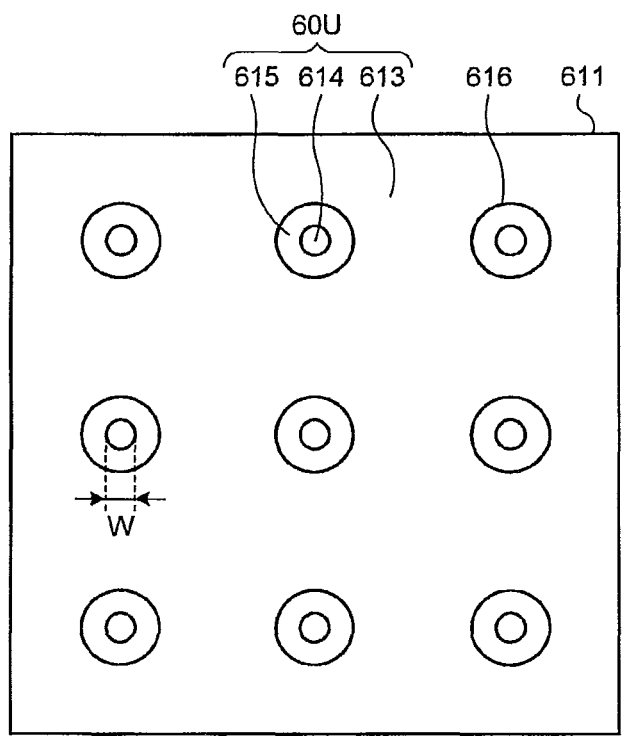
FIG. 14 is an enlarged partial plan view schematically illustrating a concavo-convex structure layer of a light-emitting device according to an example of the present invention when viewed in the thickness direction.
Figure 15:
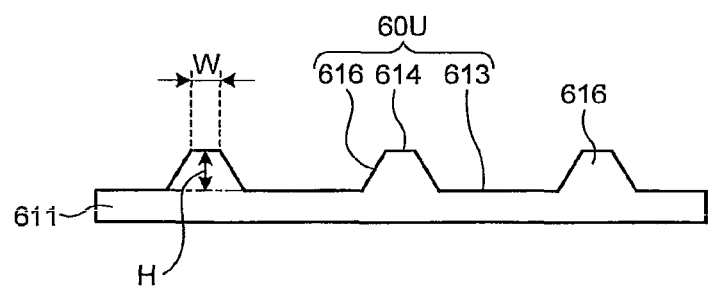
FIG. 15 is an enlarged view schematically illustrating a cross section of a concavo-convex structure layer of a light-emitting device according to an example of the present invention, wherein the cross section is along a plane parallel to the width direction and the thickness direction of a specific flat surface portion.

FIG. 14 is an enlarged partial plan view schematically illustrating the concavo-convex structure layer of a light-emitting device according to an example of the present invention when viewed in the thickness direction. FIG. 15 is an enlarged view schematically illustrating a cross section of the concavo-convex structure layer of the light-emitting device according to the example of the present invention, wherein the cross section is along a plane parallel to the width direction and the thickness direction of a specific flat surface portion. For example, as shown in FIG. 14, on a light output surface 60U of the concavo-convex structure layer 611, convex portions 616 in a truncated conical shape (the shape of a done with its top truncated in parallel to its bottom) may be provided discretely for forming the concavo-convex structure. In this case, the concavo-convex structure is formed of a flat surface portion 613 around the convex portion 616, a flat surface portion 614 on top of the convex portion 616, and an inclined surface portion 615 that is a side surface of the convex portion 616. In such a structure, the flat surface portion 614 is the specific flat surface portion having a ratio H/W of the height H to the width W, the ratio being adapted to fall within the aforementioned range (i.e., 1 or greater and 2.5 or less), as shown in FIG. 15.

Furthermore, for example, in the aforementioned embodiments, the light output surface structure layer was brought into direct contact with the surface of the organic EL element. However, the light output surface structure layer may also be provided on a surface of the organic EL element via another optional layer. Examples of the optional layer may include a gas barrier layer for protecting the organic EL element from outside air and moisture, and a UV cut layer for blocking ultraviolet radiation.

Furthermore, for example, the light output surface structure layer in the aforementioned embodiments includes the concavo-convex structure layer, the substrate film layer, the adhesive layer, and the supporting substrate. However, the light output surface structure layer may also be formed of a less number of layers than that, or alternatively may also include an optional layer in addition to those layers. For example, the concavo-convex structure layer may additionally have a coating layer on a surface thereof, so that the coating layer defines the concavo-convex structure of the light output surface.

Furthermore, for example, the light output surface may be a combination of flat surface portions and inclined surface portions which have, for example, different shapes, sizes, and angles.

Furthermore, for example, in the fourth embodiment, the concavo-convex structures of the same shape are provided on both the two light output surfaces; however, the invention is not necessarily limited to such a structure, and the shape of the concavo-convex structure of one light output surface and the shape of the concavo-convex structure of the other light output surface may be different from each other.

Furthermore, for example, in the aforementioned embodiments, all the inclined surface portions had a flat surface. However, the inclined surface may also be a curved surface.

[6. Applications]

The light-emitting device of the present invention may be used for, for example, lighting apparatus and backlight units. The lighting apparatus includes the light-emitting device of the present invention as a light source, and may further include, if necessary, optional components such as a member for holding the light source and a circuit for supplying electric power. Furthermore, the backlight unit includes the light-emitting device of the present invention as a light source, and may further include, if necessary, optional components such as a housing, a circuit for supplying power, a diffusion plate for making more uniform the light extracted from the light-emitting device, a diffusion sheet, and a prism sheet. The backlight unit may be used as a backlight for, for example, a display device, such as liquid crystal display devices, which controls pixels so as to display images, and for a display device which displays stationary images such as signboards.

EXAMPLES

Now, examples will be illustrated to specifically describe the present invention. However, the present invention is not limited to the examples shown below, but may be modified without departing from the scope of the claims and the scope of the equivalents thereof.

In the following descriptions, the refractive index of a resin will indicate the refractive index of the resin after curing. Unless otherwise specified, "part" and "%" represent quantity by weight. Unless otherwise specified, the operations in the following descriptions were carried out at ordinary temperature at normal pressure. Furthermore, the azimuth angle direction indicates a direction in parallel to a surface on which a concavo-convex structure is formed.

Example 1

[Manufacture of Multi-Layered Bod]

A roll of film substrate (Trade name "ZEONOR film", made by ZEON CORPORATION, alicyclic structure-containing polymer resin film, thickness: 100 μm, refractive index: 1.53) was coated with a UV curable resin (refractive index: 1.54) mainly composed of urethane acrylate so as to form a coating layer. Against the coating layer, a metal mold was pushed. Keeping this state, the coating layer was irradiated and thereby cured with ultraviolet radiation at 1.5 mJ/cm$^2$ so as to form a concavo-convex structure layer (thickness: 130 μm) having a concavo-convex structure.

The metal mold for forming the concavo-convex structure was manufactured by cutting grooves in eight azimuth angle directions using a cutting tool with an apex angle of 5° and a tip end width of 50 μm. The eight azimuth angle directions were 0° direction, 22.5°direction, 45° direction, 67.5° direction, 90° direction, 112.5° direction, 135° direction, and 157.5° direction. All the cutting pitches were 2.0 mm, and all the grooves were 125.0 μm in depth.

Formed on the surface of the resulting concavo-convex structure layer was a concavo-convex structure with a number of convex portions which had a trapezoidal cross section corresponding to the grooves formed on the metal mold. On the surface of the concavo-convex structure layer on which the concavo-convex structure was formed, the mean inclination angle of the inclined surface portion relative to the flat surface portions was 87.5°. The ratio of the projected area of the inclined surface portion relative to the total area (entire area) of the flat surface portions was 0.083. The flat surface portion on top of the convex portion was the specific flat surface portion, of which ratio H/W of the height H to the width W was 2.5. The maximum difference between the levels of the flat surface portions in the thickness direction was 125.1 μm.

[Manufacture of Transparent Organic EL Element]

On the principal surface of a glass substrate on which a transparent electrode layer had been formed, a hole injection layer, a hole transport layer, a light-emitting layer, a hole blocking layer, a electric charge generation layer, a metal oxide layer, and a cathode were formed in this order. The materials for forming respective layers and the thicknesses thereof were as follows.

Transparent electrode layer: ITO of 300 nm
Hole injection layer: trioxide molybdenum ($MoO_3$) of 5 nm
Hole transport layer: NS-21 [by Nippon Steel Chemical Co., Ltd.] and $MoO_3$ of 20 nm, and additionally NS-21 of 5 nm, being 25 nm in total
Light-emitting layer: NS-21 and EY52 (by e-Ray Optoelectronics Technology (hereinafter referred to as e-Ray)) of 20 nm, and EB43 and EB52 (both by e-Ray) of 30 nm, being 50 nm in total
Hole blocking layer: bis(2-methyl-8-quinolinolate) (p-phenylphenolate) aluminum (BAlq) of 5 nm
Charge generation layer: Liq and DPB of 35 nm, and additionally aluminum of 1.5 nm, and additionally NS-21 and $MoO_3$ of 10 nm, being 37.5 nm in total
Metal oxide layer: $MoO_3$ of 5 nm
Cathode: ITO of 100 nm The layers from the hole injection layer to the metal oxide layer were formed by placing in a vacuum evaporator the glass substrate having the transparent electrode layer formed thereon, and then the materials for the layers from the aforementioned hole transport layer to the metal oxide layer were sequentially vapor-deposited by resistance heating. The pressure in the system was set to $5 \times 10^{-3}$ Pa and evaporation speed was set to 0.1 to 0.2 nm/s. Subsequently, the ITO of the cathode layer was deposited by facing-target sputtering. This was sealed with a UV curable resin on another glass plate, to thereby obtain a transparent organic EL element 1. Electricity was applied to the resulting transparent organic EL element 1 for driving the element, whereby good white light was obtained. The element had an outstanding transparency in both the front and oblique directions. Herein the term the "front direction" refers to the normal direction of the principal plane of the organic EL element, and the term the "oblique direction" refers to a direction which is tilted by 45° relative to the principal surface of the organic EL element.

[Manufacture of Light-Emitting Device 1]

The film substrate with the concavo-convex structure layer formed thereon was affixed to the resulting transparent organic EL element 1 via an adhesive layer (acrylic-based resin, refractive index: 1.49, manufactured by NITTO DENKO CORPORATION, C59621), to thereby obtain a light-emitting device 1 having a layer structure of (the transparent organic EL element 1)—(the adhesive layer)—(the film substrate)—(the concavo-convex structure layer). Electricity was applied to the resulting light-emitting device 1 to emit light, and transparency of the light-emitting device 1 was visually evaluated. The light-emitting device 1 had an outstanding transparency both in the front and oblique directions.

Example 2

A metal mold was prepared by cutting grooves in four azimuth angle directions using a cutting tool with an apex angle of 25° and a tip end width of 25 μm. The four azimuth angle directions were 0° direction, 45° direction, 90° direction, and 135° direction. The cutting was carried out at pitches of 1.8 mm, 1.9 mm, 2.0 mm, 2.1 mm, and 2.2 mm in all azimuth angle directions in a random fashion for each groove. All the grooves were 50.0 μm in depth.

The concavo-convex structure layer (thickness: 55 μm) was formed and a light-emitting device 2 was manufactured in the same manner as in Example 1 except that the metal mold manufactured as mentioned above was employed.

Formed on the surface of the resulting concavo-convex structure layer was a concavo-convex structure with a number of convex portions which had a trapezoidal cross section corresponding to the grooves formed on the metal mold. On the surface of the concavo-convex structure layer on which the concavo-convex structure was formed, the mean inclination angle of the inclined surface portion relative to the flat surface portions was 77.5°. The ratio of the projected area of the inclined surface portion relative to the total area of the flat surface portions was 0.096. The flat surface portion on top of the convex portion was the specific flat surface portion, of which ratio H/W of the height H to the width W was 2.0. The maximum difference between the levels of the flat surface portions in the thickness direction was 50.1 μm.

Electricity was applied to the resulting light-emitting device 2 to emit light, and transparency of the light-emitting device 2 was visually evaluated. The light-emitting device 2 had an outstanding transparency both in the front and oblique directions.

Example 3

A metal mold was prepared by cutting grooves in six azimuth angle directions using a cutting tool with an apex angle of 10° and a tip end width of 70 μm. The six azimuth angle directions were 0° direction, 30° direction, 60° direction, 90° direction, 120° direction, and 150° direction. The cutting was carried out at pitches of 2.7 mm, 2.85 mm, 3.0 mm, 3.15 mm, and 3.3 mm in all azimuth angle directions in a random fashion for each groove. All the grooves were 140.0 μm in depth.

The concavo-convex structure layer (thickness: 145 μm) was formed and a light-emitting device 3 was manufactured in the same manner as in Example 1 except that the metal mold manufactured as mentioned above was employed.

On the surface of the resulting concavo-convex structure layer on which the concavo-convex structure was formed, the mean inclination angle of the inclined surface portion relative to the flat surface portions was 85.0°. The ratio of the projected area of the inclined surface portion relative to the total area of the flat surface portions was 0.098. The flat surface portion on top of the convex portion was the specific flat surface portion, of which ratio H/W of the height H to the width W was 2.0. The maximum difference between the levels of the flat surface portions in the thickness direction was 140.1 μm.

Electricity was applied to the resulting light-emitting device 3 to emit light, and transparency of the light-emitting device 3 was visually evaluated. The light-emitting device 3 had an outstanding transparency both in the front and oblique directions.

Example 4

A metal mold was prepared by cutting grooves in two azimuth angle directions using a cutting tool with an apex angle of 25° and a tip end width of 100 µm. The two azimuth angle directions were 0° direction and 90° direction. All the cutting pitches were 3 mm, and all the grooves were 150.0 µm in depth.

The concavo-convex structure layer (thickness: 155 µm) was formed and a light-emitting device 4 was manufactured in the same manner as in Example 1 except that the metal mold manufactured as mentioned above was employed.

On the surface of the resulting concavo-convex structure layer on which the concavo-convex structure was formed, the mean inclination angle of the inclined surface portion relative to the flat surface portions was 77.5°. The ratio of the projected area of the inclined surface portion relative to the total area of the flat surface portions was 0.096. The flat surface portion on top of the convex portion was the specific flat surface portion, of which ratio H/W of the height H to the width W was 1.5. The maximum difference between the levels of the flat surface portions in the thickness direction was 150.1 µm.

Electricity was applied to the resulting light-emitting device 4 to emit light, and transparency of the light-emitting device 4 was visually evaluated. The light-emitting device 4 had an outstanding transparency both in the front and oblique directions.

Comparative Example 2

A metal mold was prepared by cutting grooves in eight azimuth angle directions using a cutting tool with an apex angle of 15.0° and a tip end width of 30 µm. The eight azimuth angle directions were 0° direction, 22.5° direction, 45° direction, 67.5° direction, 90° direction, 112.5° direction, 135° direction, and 162.5° direction. All the cutting pitches were 1.2 mm, and all the grooves were 90.0 µm in depth.

The concavo-convex structure layer (thickness: 95 µm) was formed and a light-emitting device 5 was manufactured in the same manner as in Example 1 except that the metal mold manufactured as mentioned above was employed.

On the surface of the resulting concavo-convex structure layer on which the concavo-convex structure was formed, the mean inclination angle of the inclined surface portion relative to the flat surface portions was 82.5°. The ratio of the projected area of the inclined surface portion relative to the total area of the flat surface portions was 0.358. The flat surface portion on top of the convex portion had a ratio H/W of the height H and the width W being 3.0. The maximum difference between the levels of the flat surface portions in the thickness direction was 90.1 µm.

Electricity was applied to the resulting light-emitting device 5 to emit light, and transparency of the light-emitting device 5 was visually evaluated. The light-emitting device 5 had a poor transparency both in the front and oblique directions.

Comparative Example 3

A metal mold was prepared by cutting grooves in four azimuth angle directions using a cutting tool with an apex angle of 20.0° and a tip end width of 200.0 µm. The four azimuth angle directions were 0° direction, 45° direction, 90° direction, and 135° direction. The cutting was carried out at pitches of 0.9 mm, 0.95 mm, 1 mm, 1.05 mm, and 1.1 mm in all azimuth angle directions in a random fashion for each groove. All the grooves were 140 µm in depth.

The concavo-convex structure layer (thickness: 145 µm) was formed and a light-emitting device 6 was manufactured in the same manner as in Example 1 except that the metal mold manufactured as mentioned above was employed.

On the surface of the resulting concavo-convex structure layer on which the concavo-convex structure was formed, the mean inclination angle of the inclined surface portion relative to the flat surface portions was 80.0°. The ratio of the projected area of the inclined surface portion relative to the total area of the flat surface portions was 0.255. The flat surface portion on top of the convex portion had a ratio H/W of the height H and the width W being 0.7. The maximum difference between the levels of the flat surface portions in the thickness direction was 140.1 µm.

Electricity was applied to the resulting light-emitting device 6 to emit light, and transparency of the light-emitting device 6 was visually evaluated. The light-emitting device 6 had a poor transparency both in the front and oblique directions.

Comparative Example 4

A metal mold was prepared by cutting grooves in two azimuth angle directions using a cutting tool with an apex angle of 30.0° and a tip end width of 35.0 µm. The two azimuth angle directions were 0° direction and 90° direction. The cutting was carried out at pitches of 720.0 µm, 760.0 µm, 800.0 µm, 840.0 µm, and 880.0 µm in all azimuth angle directions in a random fashion for each groove. All the grooves were 100.0 µm in depth.

The concavo-convex structure layer (thickness: 105 µm) was formed and a light-emitting device 7 was manufactured in the same manner as in Example 1 except that the metal mold manufactured as mentioned above was employed.

On the surface of the resulting concavo-convex structure layer on which the concavo-convex structure was formed, the mean inclination angle of the inclined surface portion relative to the flat surface portions was 75.0°. The ratio of the projected area of the inclined surface portion relative to the total area of the flat surface portions was 0.343. The flat surface portion on top of the convex portion had a ratio H/W of the height H and the width W being 2.9. The maximum difference between the levels of the flat surface portions in the thickness direction was 100.1 µm.

Electricity was applied to the resulting light-emitting device 7 to emit light, and transparency of the light-emitting device 7 was visually evaluated. The light-emitting device 7 had a poor transparency both in the front and oblique directions.

Comparative Example 5

A metal mold was prepared by cutting grooves in six azimuth angle directions using a cutting tool with an apex angle of 25.0° and a tip end width of 100.0 µm. The six azimuth angle directions were 0° direction, 30° direction, 60° direction, 90° direction, 120° direction, and 130° direction. All the cutting pitches were 1.5 mm, and all the grooves were 50.0 µm in depth.

The concavo-convex structure layer (thickness: 55 µm) was formed and a light-emitting device 8 was manufactured in the same manner as in Example 1 except that the metal mold manufactured as mentioned above was employed.

On the surface of the resulting concavo-convex structure layer on which the concavo-convex structure was formed, the mean inclination angle of the inclined surface portion relative to the flat surface portions was 77.5°. The ratio of the projected area of the inclined surface portion relative to the total area of the flat surface portions was 0.163. The flat surface portion on top of the convex portion had a ratio H/W of the height H and the width W being 0.5. The maximum difference between the levels of the flat surface portions in the thickness direction was 50.1 μm.

Electricity was applied to the resulting light-emitting device 8 to emit light, and transparency of the light-emitting device 8 was visually evaluated. The light-emitting device 8 had a poor transparency both in the front and oblique directions.

[Evaluations]
[Amount of Light Extraction]

With the transparent organic EL element 1 obtained in Example 1 and the light-emitting devices 1 to 8 obtained in Examples 1 to 4 and Comparative Examples 2 to 5, the intensity of light coming out of both sides was calculated by optical simulation using a program (Program name: ASAP, produced by Breault Reserch), assuming that the light-emitting layer had a luminous intensity of 1 lm. The resulting values are shown in Table 1 and Table 2.

In Table 1 and Table 2, the numerical value in the column of "Amount of light extraction through adhered surface" represents the amount of light extracted through the light output surface on which the concavo-convex structure layer with the concavo-convex structure is provided, the numerical value in the column of "Amount of light extraction through back surface" represents the amount of light extracted through the glass surface with no concavo-convex structure layer, and the numerical value in the column of "Adhered surface/back surface" represents the ratio of "Amount of light extraction through adhered surface" relative to "Amount of light extraction through back surface". Higher numerical value in the column of "Adhered surface/back surface" is an index of better light extraction effect through the adhered surface.

The transparent organic EL element 1 is regarded as Comparative Example 1. In Comparative Example 1, the numerical value in the column of "Amount of light extraction through adhered surface" and the numerical value in the column of "Amount of light extraction through back surface" both represent the amount of light extracted through a glass surface with no concavo-convex structure layer.

[Transparency of Concavo-Convex Structure Layer]

With the concavo-convex structure layers obtained in Examples 1 to 4 and Comparative Examples 2 to 5, the parallel-light transmittance and the diffused-light transmittance were calculated by optical simulation using a program (Program name: ASAP, by Breault Reserch) and (Diffused-light transmittance)/(Parallel-light transmittance+Diffused-light transmittance)×100 was then calculated as the numerical value representative of the transparency of the concavo-convex structure layer. Lower numerical value thereof is an index of better transparency observed in the thickness direction. The resulting values are shown in Table 1 and Table 2.

[Visibility]

The transparent organic EL element 1 and the light-emitting devices 1 to 8 were placed, while turned off, at 50 cm in front of a display surface on which characters each having 5 mm×5 mm size were arrayed, and the characters were observed through the transparent organic EL element 1 and the light-emitting devices 1 to 8 in the front and oblique directions. The instances wherein characters were observed clearly without smearing and distortion were classified as "Excellent," the instances wherein characters were with smearing and distortion but were readable were classified as "Good," and the instances wherein characters were with much smearing and distortion and were not clearly readable were classified as "Bad". The results are shown in Table 1 and Table 2.

TABLE 1

Results of Examples

| | Ex. 1 | Ex. 2 | Ex. 3 | Ex. 4 |
|---|---|---|---|---|
| Ratio of projected area of inclined surface portion relative to total area of flat surface portions | 0.083 | 0.096 | 0.098 | 0.096 |
| H/W of specific flat surface portion | 2.5 | 2.0 | 2.0 | 1.5 |
| Maximum difference between levels of flat surface portions in thickness direction (μm) | 125.1 | 50.1 | 140.1 | 150.1 |
| Mean inclination angle of inclined surface (°) | 87.5 | 77.5 | 85 | 77.5 |
| Front direction visibility | Excellent | Excellent | Excellent | Excellent |
| Oblique direction visibility | Excellent | Good | Good | Good |
| Amount of light extraction through adhered surface (lm) | 0.354 | 0.314 | 0.347 | 0.314 |
| Amount of light extraction through back surface (lm) | 0.254 | 0.224 | 0.246 | 0.232 |
| Adhered surface/back surface | 1.39 | 1.40 | 1.41 | 1.35 |
| Transparency of concavo-convex structure layer | 0.99 | 3.71 | 2.43 | 3.58 |

TABLE 2

Results of Comparative Examples

| | Comp. Ex. 1 | Comp. Ex. 2 | Comp. Ex. 3 | Comp. Ex. 4 | Comp. Ex. 5 |
|---|---|---|---|---|---|
| Ratio of projected area of inclined surface portion relative to total area of flat surface portions | — | 0.358 | 0.255 | 0.343 | 0.163 |
| H/W of specific flat surface portion | — | 3.0 | 0.7 | 2.9 | 0.5 |
| Maximum difference between levels of flat surface portions in thickness direction (μm) | — | 90.1 | 140.1 | 100.1 | 50.1 |
| Mean inclination angle of inclined surface (°) | — | 82.5 | 80.0 | 75.0 | 77.5 |
| Front direction visibility | Excellent | Bad | Bad | Bad | Bad |
| Oblique direction visibility | Excellent | Bad | Bad | Bad | Bad |
| Amount of light extraction through adhered surface (lm) | 0.216 | 0.423 | 0.388 | 0.38 | 0.399 |
| Amount of light extraction through back surface (lm) | 0.216 | 0.272 | 0.344 | 0.247 | 0.347 |
| Adhered surface/back surface | 1.00 | 1.56 | 1.13 | 1.54 | 1.15 |
| Transparency of concavo-convex structure layer | — | 12.14 | 11.04 | 12.25 | 13.99 |

[Discussions]

As can be seen in Table 2, Comparative Example 1 with no concavo-convex structure provided on the surface of the light-emitting device shows low light extraction efficiency. Although Comparative Examples 2 to 5 with the concavo-convex structure provided on the surface of the light-emitting device show excellent light extraction efficiency, they show inferior visibility and transparency. In contrast to them, as shown in Table 1, Examples 1 to 4 of the present invention are superior in all of light extraction efficiency, visibility, and transparency with good balance. It has thus been confirmed that the structure of the present invention can implement a light-emitting device which can extract light therefrom with high efficiency while maintaining the see-through feature.

Description of Numerals:

10, 20, 30, 40: Light emitting device 10U, 20U, 30U, 50U, 60U: Light output surface
100, 200, 300: Light output surface structure layer
110, 210, 310: Multi-layered body
111, 211, 311, 511, 611: Concavo-convex structure layer
112: Substrate film layer
113, 114, 213, 214, 513, 514, 613, 614: Flat surface portion
115, 515, 615: Inclined surface portion
116, 116X, 116Y, 216X, 216Y, 316A, 516, 616: Convex portion
117: Specific flat surface portion
121: Adhesive layer
131: Supporting substrate
140: Organic EL element
141: First transparent electrode layer
142: Light-emitting layer
143: Second transparent electrode layer
144, 145: Surface of organic EL element
151: Sealing substrate
900: Plane
901: Projected image
910: Concavo-convex structure layer
911, 912, 913: Flat surface portion
914: Convex portion
915, 916: Inclined surface

What is claimed is:

1. A light-emitting device comprising:
    an organic electroluminescent element of a double-side emission type having a first transparent electrode layer, a light-emitting layer, and a second transparent electrode layer provided in this order; and
    a light output surface structure layer provided directly or indirectly on at least one surface of the organic electroluminescent element, wherein
    the light output surface structure layer includes a concavo-convex structure on a surface opposite to the organic electroluminescent element, the concavo-convex structure having flat surface portions parallel to one surface of the organic electroluminescent element and an inclined surface portion tilted relative to the flat surface portions,
    a projected area formed by projecting the inclined surface portion in a direction perpendicular to the flat surface portions onto a plane parallel to the flat surface portions is equal to or less than 0.1 times a total area of the flat surface portions, and
    the flat surface portions have a specific flat surface portion with a ratio H/W of 1 or greater and 2.5 or less, where H and W are a height and a width of the specific flat surface portion, respectively, on a cross section thereof cut along a plane parallel to a width direction and a thickness direction thereof.

2. The light-emitting device according to claim 1, wherein a maximum value of differences between levels of the flat surface portions in a thickness direction thereof is 130 μm or less in the concavo-convex structure.

3. The light-emitting device according to claim 1, wherein the inclined surface portion is tilted at an inclination angle equal to or greater than 80° and less than 90° relative to the flat surface portions.

4. The light-emitting device according to claim 2, wherein the inclined surface portion is tilted at an inclination angle equal to or greater than 80° and less than 90° relative to the flat surface portions.

5. A lighting apparatus comprising the light-emitting device according to any one of claims 1.

* * * * *